US010440301B2

United States Patent
Li et al.

(10) Patent No.: US 10,440,301 B2
(45) Date of Patent: Oct. 8, 2019

(54) IMAGE CAPTURE DEVICE, PIXEL, AND METHOD PROVIDING IMPROVED PHASE DETECTION AUTO-FOCUS PERFORMANCE

(71) Applicant: Apple Inc., Cupertino, CA (US)

(72) Inventors: Xiangli Li, Palo Alto, CA (US); Manoj C. Patel, Moutain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/699,806

(22) Filed: Sep. 8, 2017

(65) Prior Publication Data

US 2019/0082130 A1  Mar. 14, 2019

(51) Int. Cl.
  *H04N 5/232* (2006.01)
  *G03B 13/00* (2006.01)
  (Continued)

(52) U.S. Cl.
  CPC ............. *H04N 5/3696* (2013.01); *G02B 7/09* (2013.01); *G02B 7/36* (2013.01); *H01L 27/1463* (2013.01);
  (Continued)

(58) Field of Classification Search
  CPC .... H04N 5/23212; H04N 5/374; H04N 5/378; H04N 5/2254; H01L 27/14627;
  (Continued)

(56) References Cited

U.S. PATENT DOCUMENTS 4,686,572 A    8/1987    Takatsu
4,686,648 A    8/1987    Fossum
(Continued)

FOREIGN PATENT DOCUMENTS

CN    1630350    6/2005
CN    1774032    5/2006
(Continued)

OTHER PUBLICATIONS

Shen et al., "Stresses, Curvatures, and Shape Changes Arising from Patterned Lines on Silicon Wafers," Journal of Applied Physics, vol. 80, No. 3, Aug. 1996, pp. 1388-1398.
(Continued)

*Primary Examiner* — Kelly L Jerabek
(74) *Attorney, Agent, or Firm* — Brownstein Hyatt Farber Schreck, LLC

(57) ABSTRACT

An image capture device, pixel, and method of determining a focus setting for an image capture device are described. The image capture device includes an imaging area and a pixel readout circuit. The imaging area includes a plurality of pixels. The plurality of pixels includes multiple pixels in which each pixel of the multiple pixels includes a two-dimensional array of photodetectors and a microlens. Each photodetector in the array of photodetectors for a pixel is electrically isolated from each other photodetector in the array of photodetectors. A microlens is disposed over the array of photodetectors for the pixel. The pixel readout circuit includes, per pixel, a shared readout circuit associated with the array of photodetectors for the pixel and a set of charge transfer transistors. Each charge transfer transistor is operable to connect a photodetector in the array of photodetectors to the shared readout circuit.

20 Claims, 12 Drawing Sheets

(51) Int. Cl.

| | |
|---|---|
| *H04N 5/369* | (2011.01) |
| *G02B 7/09* | (2006.01) |
| *G02B 7/36* | (2006.01) |
| *H01L 27/146* | (2006.01) |
| *H04N 5/378* | (2011.01) |
| *H04N 9/04* | (2006.01) |
| *H04N 9/07* | (2006.01) |
| *H04N 5/3745* | (2011.01) |

(52) U.S. Cl.
CPC .. *H01L 27/14621* (2013.01); *H01L 27/14627* (2013.01); *H01L 27/14641* (2013.01); *H01L 27/14645* (2013.01); *H04N 5/232122* (2018.08); *H04N 5/36961* (2018.08); *H04N 5/378* (2013.01); *H04N 5/37457* (2013.01); *H04N 9/045* (2013.01); *H04N 9/04559* (2018.08); *H04N 9/07* (2013.01); *H04N 2209/042* (2013.01)

(58) Field of Classification Search
CPC ........ H01L 27/14643; H01L 27/14634; G02B 7/365; G03B 13/32; G03B 13/36
USPC .................................. 348/345, 349
See application file for complete search history.

(56) References Cited

U.S. PATENT DOCUMENTS

| | | |
|---|---|---|
| 5,105,264 A | 4/1992 | Erhardt et al. |
| 5,329,313 A | 7/1994 | Keith |
| 5,396,893 A | 3/1995 | Oberg et al. |
| 5,471,515 A | 11/1995 | Fossum et al. |
| 5,541,402 A | 7/1996 | Ackland |
| 5,550,677 A | 8/1996 | Schofield et al. |
| 5,781,312 A | 7/1998 | Noda |
| 5,841,126 A | 11/1998 | Fossum et al. |
| 5,880,459 A | 3/1999 | Pryor et al. |
| 5,949,483 A | 9/1999 | Fossum et al. |
| 6,008,486 A | 12/1999 | Stam et al. |
| 6,040,568 A | 3/2000 | Caulfield et al. |
| 6,233,013 B1 | 5/2001 | Hosier et al. |
| 6,348,929 B1 | 2/2002 | Acharya et al. |
| 6,448,550 B1 | 9/2002 | Nishimura |
| 6,528,833 B2 | 3/2003 | Lee et al. |
| 6,541,751 B1 | 4/2003 | Bidermann |
| 6,670,904 B1 | 12/2003 | Yakovlev |
| 6,713,796 B1 | 3/2004 | Fox |
| 6,714,239 B2 | 3/2004 | Guidash |
| 6,798,453 B1 | 9/2004 | Kaifu |
| 6,816,676 B2 | 11/2004 | Bianchi et al. |
| 6,905,470 B2 | 6/2005 | Lee et al. |
| 6,931,269 B2 | 8/2005 | Terry |
| 6,956,605 B1 | 10/2005 | Hashimoto |
| 6,982,759 B2 | 1/2006 | Goto |
| 7,075,049 B2 | 7/2006 | Rhodes et al. |
| 7,084,914 B2 | 8/2006 | Van Blerkom |
| 7,091,466 B2 | 8/2006 | Bock |
| 7,119,322 B2 | 10/2006 | Hong |
| 7,133,073 B1 | 11/2006 | Neter |
| 7,259,413 B2 | 8/2007 | Rhodes |
| 7,262,401 B2 | 8/2007 | Hopper et al. |
| 7,271,835 B2 | 9/2007 | Iizuka |
| 7,282,028 B2 | 10/2007 | Kim et al. |
| 7,319,218 B2 | 1/2008 | Krymski |
| 7,332,786 B2 | 2/2008 | Altice |
| 7,390,687 B2 | 6/2008 | Boettiger |
| 7,415,096 B2 | 8/2008 | Sherman |
| 7,437,013 B2 | 10/2008 | Anderson |
| 7,443,421 B2 | 10/2008 | Stavely et al. |
| 7,446,812 B2 | 11/2008 | Ando et al. |
| 7,471,315 B2 | 12/2008 | Silsby et al. |
| 7,502,054 B2 | 3/2009 | Kalapathy |
| 7,525,168 B2 | 4/2009 | Hsieh |
| 7,554,067 B2 | 6/2009 | Zarnoski et al. |
| 7,555,158 B2 | 6/2009 | Park et al. |
| 7,589,316 B2 | 9/2009 | Dunki-Jacobs |
| 7,622,699 B2 | 11/2009 | Sakakibara et al. |
| 7,626,626 B2 | 12/2009 | Panicacci |
| 7,636,109 B2 | 12/2009 | Nakajima et al. |
| 7,667,400 B1 | 2/2010 | Goushcha |
| 7,671,435 B2 | 3/2010 | Ahn |
| 7,714,292 B2 | 5/2010 | Agarwal et al. |
| 7,728,351 B2 | 6/2010 | Shim |
| 7,733,402 B2 | 6/2010 | Egawa et al. |
| 7,742,090 B2 | 6/2010 | Street |
| 7,764,312 B2 | 7/2010 | Ono et al. |
| 7,773,138 B2 | 8/2010 | Lahav et al. |
| 7,786,543 B2 | 8/2010 | Hsieh |
| 7,796,171 B2 | 9/2010 | Gardner |
| 7,817,198 B2 | 10/2010 | Kang et al. |
| 7,838,956 B2 | 11/2010 | McCarten et al. |
| 7,873,236 B2 | 1/2011 | Li et al. |
| 7,880,785 B2 | 2/2011 | Gallagher |
| 7,884,402 B2 | 2/2011 | Ki |
| 7,906,826 B2 | 3/2011 | Martin et al. |
| 7,952,121 B2 | 5/2011 | Arimoto |
| 7,952,635 B2 | 5/2011 | Lauxtermann |
| 7,982,789 B2 | 7/2011 | Watanabe et al. |
| 8,026,966 B2 | 9/2011 | Altice |
| 8,032,206 B1 | 10/2011 | Farazi et al. |
| 8,089,036 B2 | 1/2012 | Manabe et al. |
| 8,089,524 B2 | 1/2012 | Urisaka |
| 8,094,232 B2 | 1/2012 | Kusaka |
| 8,116,540 B2 | 2/2012 | Dean |
| 8,140,143 B2 | 3/2012 | Picard et al. |
| 8,153,947 B2 | 4/2012 | Barbier et al. |
| 8,159,570 B2 | 4/2012 | Negishi |
| 8,159,588 B2 | 4/2012 | Boemler |
| 8,164,669 B2 | 4/2012 | Compton et al. |
| 8,174,595 B2 | 5/2012 | Honda et al. |
| 8,184,188 B2 | 5/2012 | Yaghmai |
| 8,194,148 B2 | 6/2012 | Doida |
| 8,194,165 B2 | 6/2012 | Border et al. |
| 8,222,586 B2 | 7/2012 | Lee |
| 8,227,844 B2 | 7/2012 | Adkisson |
| 8,233,071 B2 | 7/2012 | Takeda |
| 8,259,228 B2 | 9/2012 | Wei et al. |
| 8,310,577 B1 | 11/2012 | Neter |
| 8,324,553 B2 | 12/2012 | Lee |
| 8,338,856 B2 | 12/2012 | Tai et al. |
| 8,340,407 B2 | 12/2012 | Kalman |
| 8,350,940 B2 | 1/2013 | Smith et al. |
| 8,355,117 B2 | 1/2013 | Niclass |
| 8,388,346 B2 | 3/2013 | Rantala et al. |
| 8,400,546 B2 | 3/2013 | Itano et al. |
| 8,456,540 B2 | 6/2013 | Egawa |
| 8,456,559 B2 | 6/2013 | Yamashita |
| 8,508,637 B2 | 8/2013 | Han et al. |
| 8,514,308 B2 | 8/2013 | Itonaga et al. |
| 8,520,913 B2 | 8/2013 | Dean |
| 8,546,737 B2 | 10/2013 | Tian et al. |
| 8,547,388 B2 | 10/2013 | Cheng |
| 8,575,531 B2 | 11/2013 | Hynecek et al. |
| 8,581,992 B2 | 11/2013 | Hamada |
| 8,594,170 B2 | 11/2013 | Mombers et al. |
| 8,619,163 B2 | 12/2013 | Ogua |
| 8,619,170 B2 | 12/2013 | Mabuchi |
| 8,629,484 B2 | 1/2014 | Ohri et al. |
| 8,634,002 B2 | 1/2014 | Kita |
| 8,637,875 B2 | 1/2014 | Finkelstein et al. |
| 8,648,947 B2 | 2/2014 | Sato et al. |
| 8,653,434 B2 | 2/2014 | Johnson et al. |
| 8,723,975 B2 | 5/2014 | Solhusvik |
| 8,724,096 B2 | 5/2014 | Gosch et al. |
| 8,730,345 B2 | 5/2014 | Watanabe |
| 8,754,983 B2 | 6/2014 | Sutton |
| 8,755,854 B2 | 6/2014 | Addison et al. |
| 8,759,736 B2 | 6/2014 | Yoo |
| 8,760,413 B2 | 6/2014 | Peterson et al. |
| 8,767,104 B2 | 7/2014 | Makino et al. |
| 8,803,990 B2 | 8/2014 | Smith |
| 8,810,703 B2 | 8/2014 | Mabuchi |
| 8,817,154 B2 | 8/2014 | Manabe et al. |

(56) References Cited

U.S. PATENT DOCUMENTS

| | | |
|---|---|---|
| 8,879,686 B2 | 11/2014 | Okada et al. |
| 8,902,330 B2 | 12/2014 | Theuwissen |
| 8,902,341 B2 | 12/2014 | Machida |
| 8,908,073 B2 | 12/2014 | Minagawa |
| 8,923,994 B2 | 12/2014 | Laikari et al. |
| 8,934,030 B2 | 1/2015 | Kim et al. |
| 8,936,552 B2 | 1/2015 | Kateraas et al. |
| 8,946,610 B2 | 2/2015 | Iwabuchi et al. |
| 8,982,237 B2 | 3/2015 | Chen |
| 9,006,641 B2 | 4/2015 | Drader |
| 9,041,837 B2 | 5/2015 | Li |
| 9,017,748 B2 | 6/2015 | Theuwissen |
| 9,054,009 B2 | 6/2015 | Oike et al. |
| 9,058,081 B2 | 6/2015 | Baxter |
| 9,066,017 B2 | 6/2015 | Geiss |
| 9,066,660 B2 | 6/2015 | Watson et al. |
| 9,088,727 B2 | 7/2015 | Trumbo |
| 9,094,623 B2 | 7/2015 | Kawaguchi |
| 9,099,604 B2 | 8/2015 | Roy |
| 9,100,597 B2 | 8/2015 | Hu |
| 9,106,859 B2 | 8/2015 | Kizuna et al. |
| 9,131,171 B2 | 9/2015 | Aoki et al. |
| 9,151,829 B2 | 10/2015 | Campbell |
| 9,154,750 B2 | 10/2015 | Pang |
| 9,160,949 B2 | 10/2015 | Zhang et al. |
| 9,164,144 B2 | 10/2015 | Dolinsky |
| 9,178,100 B2 | 11/2015 | Webster et al. |
| 9,209,320 B1 | 12/2015 | Webster |
| 9,225,948 B2 | 12/2015 | Hasegawa |
| 9,232,150 B2 | 1/2016 | Kleekajai et al. |
| 9,232,161 B2 | 1/2016 | Suh |
| 9,235,267 B2 | 1/2016 | Burrough et al. |
| 9,270,906 B2 | 2/2016 | Peng et al. |
| 9,276,031 B2 | 3/2016 | Wan |
| 9,277,144 B2 | 3/2016 | Kleekajai et al. |
| 9,287,304 B2 | 3/2016 | Park et al. |
| 9,288,404 B2 | 3/2016 | Papiashvili |
| 9,293,500 B2 | 3/2016 | Sharma et al. |
| 9,312,401 B2 | 4/2016 | Webster |
| 9,313,434 B2 | 4/2016 | Dutton et al. |
| 9,319,611 B2 | 4/2016 | Fan |
| 9,331,116 B2 | 5/2016 | Webster |
| 9,344,649 B2 | 5/2016 | Bock |
| 9,380,245 B1 | 6/2016 | Guidash |
| 9,392,237 B2 | 7/2016 | Toyoda |
| 9,417,326 B2 | 8/2016 | Niclass et al. |
| 9,438,258 B1 | 9/2016 | Yoo |
| 9,445,018 B2 | 9/2016 | Fettig et al. |
| 9,448,110 B2 | 9/2016 | Wong |
| 9,451,887 B2 | 9/2016 | Watson et al. |
| 9,467,553 B2 | 10/2016 | Heo et al. |
| 9,473,706 B2 | 10/2016 | Malone et al. |
| 9,478,030 B1 | 10/2016 | Lecky |
| 9,479,688 B2 | 10/2016 | Ishii |
| 9,490,285 B2 | 11/2016 | Itonaga |
| 9,497,397 B1 | 11/2016 | Kleekajai et al. |
| 9,503,616 B2 | 11/2016 | Taniguchi et al. |
| 9,516,244 B2 | 12/2016 | Borowski |
| 9,538,106 B2 | 1/2017 | McMahon et al. |
| 9,549,099 B2 | 1/2017 | Fan |
| 9,560,339 B2 | 1/2017 | Borowski |
| 9,584,743 B1 | 2/2017 | Lin et al. |
| 9,596,420 B2 | 3/2017 | Fan et al. |
| 9,596,423 B1 | 3/2017 | Molgaard |
| 9,639,063 B2 | 5/2017 | Dutton et al. |
| 9,661,308 B1 | 5/2017 | Wang et al. |
| 9,686,485 B2 | 6/2017 | Agranov et al. |
| 9,700,240 B2 | 7/2017 | Letchner et al. |
| 9,741,754 B2 | 8/2017 | Li et al. |
| 9,749,556 B2 | 8/2017 | Fettig et al. |
| 9,774,318 B2 | 9/2017 | Song |
| 9,781,368 B2 | 10/2017 | Song |
| 9,831,283 B2 | 11/2017 | Shepard et al. |
| 9,894,304 B1 | 2/2018 | Smith |
| 9,912,883 B1 | 3/2018 | Agranov et al. |
| 9,952,323 B2 | 4/2018 | Deane |
| 10,136,090 B2 | 11/2018 | Vogelsang et al. |
| 10,153,310 B2 | 12/2018 | Zhang et al. |
| 10,285,626 B1 | 5/2019 | Kestelli et al. |
| 2003/0036685 A1 | 2/2003 | Goodman et al. |
| 2004/0207836 A1 | 10/2004 | Chhibber et al. |
| 2005/0026332 A1 | 2/2005 | Fratti et al. |
| 2006/0274161 A1 | 12/2006 | Ing et al. |
| 2007/0263099 A1 | 11/2007 | Motta et al. |
| 2008/0177162 A1 | 7/2008 | Bae et al. |
| 2008/0315198 A1 | 12/2008 | Jung |
| 2009/0096901 A1 | 4/2009 | Bae et al. |
| 2009/0101914 A1 | 4/2009 | Hirotsu et al. |
| 2009/0146234 A1 | 6/2009 | Luo et al. |
| 2009/0201400 A1 | 8/2009 | Zhang et al. |
| 2009/0219266 A1 | 9/2009 | Lim et al. |
| 2010/0110018 A1 | 5/2010 | Faubert et al. |
| 2010/0134631 A1 | 6/2010 | Voth |
| 2011/0080500 A1 | 4/2011 | Wang et al. |
| 2011/0156197 A1 | 6/2011 | Tivarus et al. |
| 2011/0164162 A1 | 7/2011 | Kato |
| 2011/0193824 A1 | 8/2011 | Modarres et al. |
| 2012/0092541 A1 | 4/2012 | Tuulos et al. |
| 2012/0098964 A1 | 4/2012 | Oggier et al. |
| 2012/0127088 A1 | 5/2012 | Pance et al. |
| 2012/0162632 A1 | 6/2012 | Dutton |
| 2013/0147981 A1 | 6/2013 | Wu |
| 2014/0049683 A1 | 2/2014 | Guenter |
| 2014/0071321 A1 | 3/2014 | Seyama |
| 2014/0132528 A1 | 5/2014 | Catton |
| 2014/0231630 A1 | 8/2014 | Rae et al. |
| 2015/0002713 A1* | 1/2015 | Nomura ............ H04N 5/23212 348/302 |
| 2015/0062391 A1* | 3/2015 | Murata ............ H01L 27/14603 348/280 |
| 2015/0277559 A1 | 10/2015 | Vescovi et al. |
| 2015/0312479 A1 | 10/2015 | McMahon et al. |
| 2015/0350583 A1* | 12/2015 | Mauritzson ............ H04N 5/378 250/208.1 |
| 2016/0050379 A1 | 2/2016 | Jiang et al. |
| 2016/0099371 A1 | 4/2016 | Webster |
| 2016/0205311 A1 | 7/2016 | Mandelli et al. |
| 2016/0218236 A1 | 7/2016 | Dhulla et al. |
| 2016/0219232 A1 | 7/2016 | Murata |
| 2016/0274237 A1 | 9/2016 | Stutz |
| 2016/0307325 A1 | 10/2016 | Wang et al. |
| 2016/0356890 A1 | 12/2016 | Fried et al. |
| 2016/0365380 A1 | 12/2016 | Wan |
| 2017/0047363 A1 | 2/2017 | Choi et al. |
| 2017/0052065 A1 | 2/2017 | Sharma et al. |
| 2017/0082746 A1 | 3/2017 | Kubota et al. |
| 2017/0084133 A1 | 3/2017 | Cardinali et al. |
| 2017/0142325 A1* | 5/2017 | Shimokawa ............ G02B 7/28 |
| 2017/0223292 A1 | 8/2017 | Ikeda |
| 2017/0272675 A1 | 9/2017 | Kobayashi |
| 2017/0364736 A1 | 12/2017 | Ollila |
| 2017/0373106 A1 | 12/2017 | Li et al. |
| 2018/0090526 A1 | 3/2018 | Mandai et al. |
| 2018/0090536 A1 | 3/2018 | Mandai et al. |
| 2018/0109742 A1 | 4/2018 | Agranov et al. |
| 2018/0209846 A1 | 7/2018 | Mandai et al. |
| 2018/0213205 A1* | 7/2018 | Oh ............ H01L 27/14634 |
| 2019/0018119 A1 | 1/2019 | Laifenfeld et al. |
| 2019/0027674 A1 | 1/2019 | Zhang et al. |

FOREIGN PATENT DOCUMENTS

| | | |
|---|---|---|
| CN | 1833429 | 9/2006 |
| CN | 1842138 | 10/2006 |
| CN | 1947414 | 4/2007 |
| CN | 101189885 | 5/2008 |
| CN | 101221965 | 7/2008 |
| CN | 101233763 | 7/2008 |
| CN | 101472059 | 7/2009 |
| CN | 101567977 | 10/2009 |
| CN | 101622859 | 1/2010 |
| CN | 101739955 | 6/2010 |
| CN | 101754029 | 6/2010 |
| CN | 101803925 | 8/2010 |

(56) References Cited

FOREIGN PATENT DOCUMENTS

| | | |
|---|---|---|
| CN | 102036020 | 4/2011 |
| CN | 102067584 | 5/2011 |
| CN | 102208423 | 10/2011 |
| CN | 102451160 | 5/2012 |
| CN | 102668542 | 9/2012 |
| CN | 102820309 | 12/2012 |
| CN | 102821255 | 12/2012 |
| CN | 103024297 | 4/2013 |
| CN | 103051843 | 4/2013 |
| CN | 103329513 | 9/2013 |
| CN | 103546702 | 1/2014 |
| CN | 204761615 | 11/2015 |
| DE | 102010060527 | 4/2012 |
| EP | 1763228 | 3/2007 |
| EP | 2023611 | 2/2009 |
| EP | 2107610 | 10/2009 |
| EP | 2230690 | 9/2010 |
| EP | 2512126 | 10/2012 |
| EP | 2787531 | 10/2014 |
| JP | S61123287 | 6/1986 |
| JP | 2007504670 | 8/1987 |
| JP | 2000059697 | 2/2000 |
| JP | 2001211455 | 8/2001 |
| JP | 2001358994 | 12/2001 |
| JP | 2004111590 | 4/2004 |
| JP | 2005318504 | 11/2005 |
| JP | 2006287361 | 10/2006 |
| JP | 2007516654 | 6/2007 |
| JP | 2008507908 | 3/2008 |
| JP | 2008271280 | 11/2008 |
| JP | 2008543061 | 11/2008 |
| JP | 2009021809 | 1/2009 |
| JP | 2009159186 | 7/2009 |
| JP | 2009212909 | 9/2009 |
| JP | 2009296465 | 12/2009 |
| JP | 2010080604 | 4/2010 |
| JP | 2010114834 | 5/2010 |
| JP | 2011040926 | 2/2011 |
| JP | 201149697 | 3/2011 |
| JP | 2011091775 | 5/2011 |
| JP | 11-216970 | 10/2011 |
| JP | 11-217315 | 10/2011 |
| JP | 2011097646 | 12/2011 |
| JP | 2012010306 | 1/2012 |
| JP | 2012019516 | 1/2012 |
| JP | 2012513160 | 6/2012 |
| JP | 2013051523 | 3/2013 |
| JP | 2013070240 | 4/2013 |
| JP | 2013529035 | 7/2013 |
| JP | 2014081254 | 5/2014 |
| JP | 2016145776 | 8/2016 |
| KR | 20030034424 | 5/2003 |
| KR | 20030061157 | 7/2003 |
| KR | 20050103732 | 11/2005 |
| KR | 2008/0069851 | 7/2008 |
| KR | 20100008239 | 1/2010 |
| KR | 20100065084 | 6/2010 |
| KR | 20130074459 | 7/2013 |
| TW | 200520551 | 6/2005 |
| TW | 200803481 | 1/2008 |
| TW | 201110689 | 3/2011 |
| TW | 201301881 | 1/2013 |
| WO | WO 05/041304 | 5/2005 |
| WO | WO 06/014641 | 2/2006 |
| WO | WO 06/130443 | 12/2006 |
| WO | WO 07/049900 | 5/2007 |
| WO | WO 10/120945 | 10/2010 |
| WO | WO 12/011095 | 1/2012 |
| WO | WO 12/032353 | 3/2012 |
| WO | WO 12/053363 | 4/2012 |
| WO | WO 12/088338 | 6/2012 |
| WO | WO 12/122572 | 9/2012 |
| WO | WO 12/138687 | 10/2012 |
| WO | WO 13/008425 | 1/2013 |
| WO | WO 13/179018 | 12/2013 |
| WO | WO 13/179020 | 12/2013 |
| WO | WO 17/112416 | 6/2017 |

OTHER PUBLICATIONS

U.S. Appl. No. 15/713,477, filed Sep. 22, 2017, Mandai et al.
U.S. Appl. No. 15/713,520, filed Sep. 22, 2017, Mandai et al.
U.S. Appl. No. 15/879,365, filed Jan. 24, 2018, Mandai et al.
U.S. Appl. No. 15/879,350, filed Jan. 24, 2018, Mandai et al.
U.S. Appl. No. 15/880,285, filed Jan. 25, 2018, Laifenfeld et al.
Aoki, et al., "Rolling-Shutter Distortion-Free 3D Stacked Image Sensor with −160dB Parasitic Light Sensitivity In-Pixel Storage Node," ISSCC 2013, Session 27, Image Sensors, 27.3 27.3 A, Feb. 20, 2013, retrieved on Apr. 11, 2014 from URL:http://ieeexplore.ieee.org/stamp/stamp.jsp?tp=&arnumber=6487824.
Elgendi, "On the Analysis of Fingertip Photoplethysmogram Signals," Current Cardiology Reviews, 2012, vol. 8, pp. 14-25.
Feng, et al., "On the Stoney Formula for a Thin Film/Substrate System with Nonuniform Substrate Thickness," Journal of Applied Mechanics, Transactions of the ASME, vol. 74, Nov. 2007, pp. 1276-1281.
Fu, et al., "Heart Rate Extraction from Photoplethysmogram Waveform Using Wavelet Multui-resolution Analysis," Journal of Medical and Biological Engineering, 2008, vol. 28, No. 4, pp. 229-232.
Han, et al., "Artifacts in wearable photoplethysmographs during daily life motions and their reduction with least mean square based active noise cancellation method," Computers in Biology and Medicine, 2012, vol. 42, pp. 387-393.
Lopez-Silva, et al., "Heuristic Algorithm for Photoplethysmographic Heart Rate Tracking During Maximal Exercise Test," Journal of Medical and Biological Engineering, 2011, vol. 12, No. 3, pp. 181-188.
Santos, et al., "Accelerometer-assisted PPG Measurement During Physical Exercise Using the LAVIMO Sensor System," Acta Polytechnica, 2012, vol. 52, No. 5, pp. 80-85.
Sarkar, et al., "Fingertip Pulse Wave (PPG signal) Analysis and Heart Rate Detection," International Journal of Emerging Technology and Advanced Engineering, 2012, vol. 2, No. 9, pp. 404-407.
Schwarzer, et al., On the determination of film stress from substrate bending: Stoney's formula and its limits, Jan. 2006, 19 pages.
Yan, et al., "Reduction of motion artifact in pulse oximetry by smoothed pseudo Wigner-Ville distribution," Journal of NeuroEngineering and Rehabilitation, 2005, vol. 2, No. 3, pp. 1-9.
Yousefi, et al., "Adaptive Cancellation of Motion Artifact in Wearable Biosensors," 34th Annual International Conference of the IEEE EMBS, San Diego, California, Aug./Sep. 2012, pp. 2004-2008.
U.S. Appl. No. 15/590,775, filed May 9, 2017, Lee.
U.S. Appl. No. 15/627,409, filed Jun. 19, 2017 Agranov et al.
U.S. Appl. No. 15/653,468, filed Jul. 18, 2017, Zhang et al.
U.S. Appl. No. 15/682,255, filed Aug. 21, 2017, Li et al.
U.S. Appl. No. 16/226,491, filed Dec. 19, 2018, McMahon.
International Search Report and Written Opinion dated Nov. 12, 2018, PCT/US2018/048581, 12 pages.
Jahromi et al., "A Single Chip Laser Radar Receiver with a 9×9 SPAD Detector Array and a 10-channel TDC," 2013 Proceedings of the ESSCIRC, IEEE, Sep. 14, 2015, pp. 364-367.
Charbon, et al., SPAD-Based Sensors, TOF Range-Imaging Cameras, F. Remondino and D. Stoppa (eds.), 2013, Springer-Verlag Berlin Heidelberg, pp. 11-38.
Cox, "Getting histograms with varying bin widths," http://www.stata.com/support/faqs/graphics/histograms-with-varying-bin-widths/, Nov. 13, 2017, 5 pages.
Gallivanoni, et al., "Progress n Quenching Circuits for Single Photon Avalanche Diodes," IEEE Transactions on Nuclear Science, vol. 57, No. 6, Dec. 2010, pp. 3815-3826.
Leslar, et al., "Comprehensive Utilization of Temporal and Spatial Domain Outlier Detection Methods for Mobile Terrestrial LiDAR Data," Remote Sensing, 2011, vol. 3, pp. 1724-1742.
Mota, et al., "A flexible multi-channel high-resolution Time-to-Digital Converter ASIC," Nuclear Science Symposium Conference

(56) References Cited

OTHER PUBLICATIONS

*Record IEEE*, 2000, Engineering School of Geneva, Microelectronics Lab, Geneva, Switzerland, 8 pages.
Niclass, et al., "Design and Characterization of a CMOS 3-D Image Sensor Based on Single Photon Avalanche Diodes," *IEEE Journal of Solid-State Circuits*, vol. 40, No. 9, Sep. 2005, pp. 1847-1854.
Shin, et al., "Photon-Efficient Computational 3D and Reflectivity Imaging with Single-Photon Detectors," IEEE International Conference on Image Processing, Paris, France, Oct. 2014, 11 pages.
Tisa, et al., "Variable-Load Quenching Circuit for single-photon avalanche diodes," Optics Express, vol. 16, No. 3, Feb. 4, 2008, pp. 2232-2244.
Ullrich, et al., "Linear LIDAR versus Geiger-mode LIDAR: Impact on data properties and data quality," *Laser Radar Technology and Applications XXI*, edited by Monte D. Turner, Gary W. Kamerman, Proc. of SPIE, vol. 9832, 983204, 2016, 17 pages.

* cited by examiner

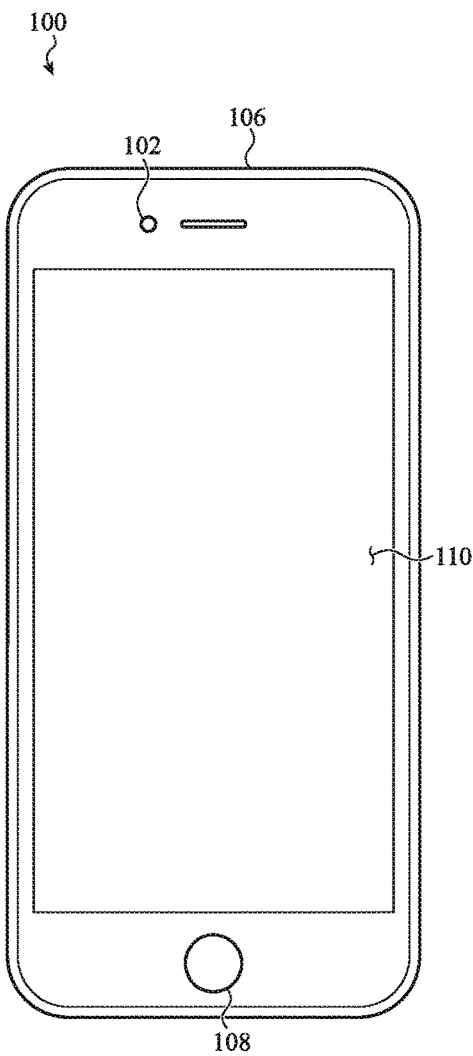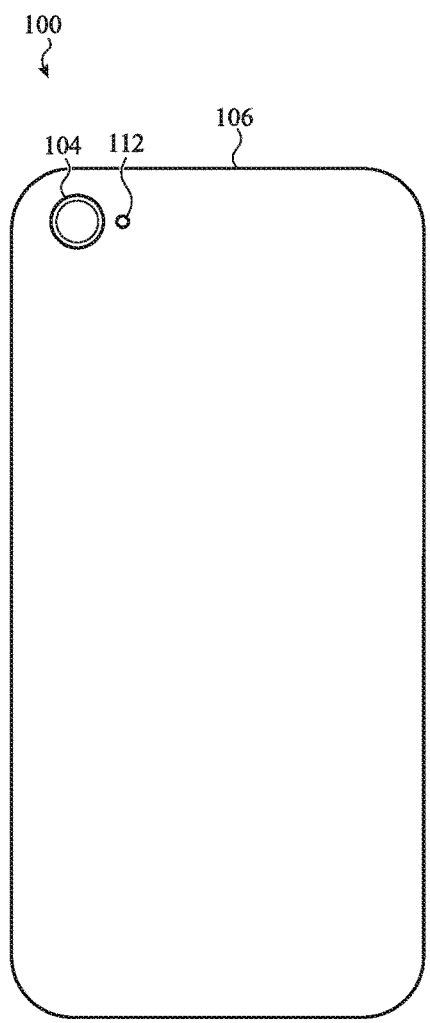
FIG. 1A
FIG. 1B

IMAGE CAPTURE DEVICE, PIXEL, AND METHOD PROVIDING IMPROVED PHASE DETECTION AUTO-FOCUS PERFORMANCE

FIELD

The described embodiments relate generally to a device having a camera or other image capture device. More particularly, the described embodiments relate to an image capture device, pixel, and method of operating an image capture device or pixel, that provides improved phase detection auto-focus (PDAF) performance for a device having a camera or other image capture device.

BACKGROUND

Cameras and other image capture devices often use an image sensor, such as a charge-coupled device (CCD) image sensor or a complementary metal-oxide-semiconductor (CMOS) image sensor, to capture an image. In some cases, a camera or other image capture device may use multiple image sensors, with the different image sensors having adjacent or interlaced arrays of pixels.

Many cameras and other image capture devices include one or more optical components (e.g., a lens) that are configurable to focus light received or reflected from an image on the surface of an image sensor. Before or while capturing an image, the distance between the optical component(s) and image sensor (or a tilt or other parameters of the optical components or image sensor) may be adjusted to focus an image on the image sensor. In some cases, macro (or rough) focusing may be performed for an image sensor prior to capturing an image using the image sensor (e.g., using a macro focus mechanism adjacent the image sensor). Micro (or fine) focusing is often performed after acquiring one or more images using the image sensor. Many cameras and other image capture devices perform focusing operations frequently, and in some cases before or after each image capture frame.

Focusing an image on an image sensor often entails identifying a perceptible edge between objects, or an edge defined by different colors or brightness (e.g., an edge between dark and light regions), and bringing the edge into focus. Because low light conditions tend to mute the edges in an image, focusing an image on an image sensor can be particularly difficult under low light conditions, and an optimum focus may take longer to achieve or not be possible.

SUMMARY

Embodiments of the systems, devices, methods, and apparatus described in the present disclosure are directed to an image capture device, pixel, or method of operating an image capture device or pixel, that provides improved PDAF performance for a device having a camera or other image capture device.

In a first aspect, the present disclosure describes an image capture device. The image capture device may include an imaging area and a pixel readout circuit. The imaging area may include a plurality of pixels. Multiple pixels of the plurality of pixels may each include a two-dimensional array of photodetectors and a microlens. Each photodetector in the array of photodetectors for a pixel may be electrically isolated from each other photodetector in the array of photodetectors. A microlens may be disposed over the array of photodetectors for the pixel. The pixel readout circuit may include, per pixel, a shared readout circuit associated with the array of photodetectors for the pixel and a set of charge transfer transistors. Each charge transfer transistor may be operable to connect a photodetector in the array of photodetectors to the shared readout circuit.

In another aspect, the present disclosure describes a pixel. The pixel may include an imaging area, a microlens, and a same color light filter. The imaging area may include a two-dimensional array of photodetectors, with each photodetector in the array of photodetectors being electrically isolated from each other photodetector in the array of photodetectors. The microlens may be disposed over the array of photodetectors. The microlens may include a light-receiving side opposite the array of photodetectors. The light-receiving side of the microlens may include a central portion and peripheral portion. The peripheral portion of the microlens may be configured to redirect at least a portion of light incident on the peripheral portion toward a corresponding peripheral portion of the imaging area. The same color light filter may be disposed over the array of photodetectors.

In still another aspect of the disclosure, a method of determining a focus setting for an image capture device is described. The image capture device may include an image sensor having a plurality of pixels. The plurality of pixels may include multiple pixels that each include a two-dimensional array of photodetectors disposed under a microlens. Each photodetector in the array of photodetectors may be electrically isolated from each other photodetector in the array of photodetectors. The method may include capturing one or more images using a first focus setting for the image capture device; analyzing horizontal phase detection signals output from a first set of the multipole pixels while capturing the one or more images; analyzing vertical phase detection signals output from a second set of the multiple pixels while capturing the one or more images; and adjusting the first focus setting to a second focus setting based on the horizontal phase detection signal analysis and the vertical phase detection signal analysis.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which:

FIGS. 1A-1B show front and rear views of an electronic device that includes one or more image capture devices (e.g., cameras);

Figure 2:
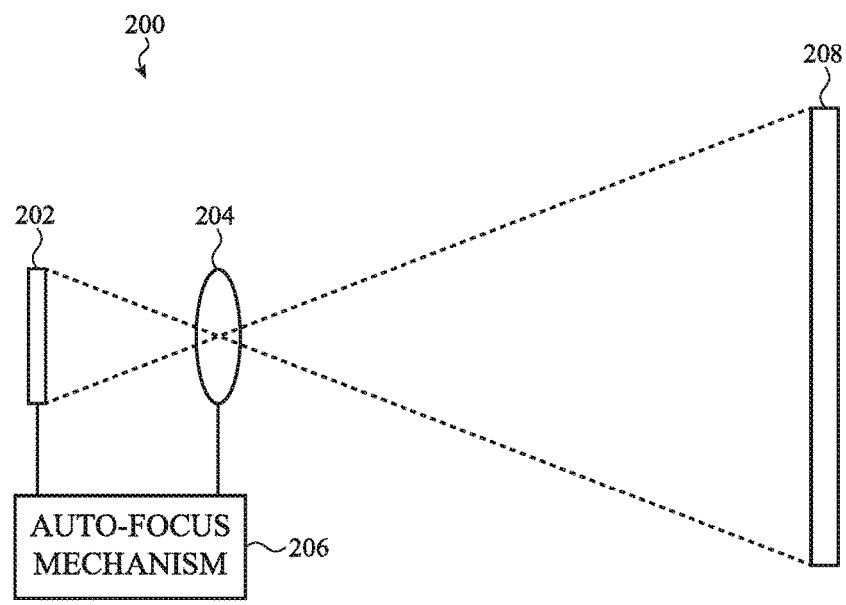
FIG. 2 shows an example embodiment of a camera, including an image sensor, a lens, and an auto-focus mechanism.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

The present disclosure relates to an image capture device, pixel, and method of operating an image capture device or pixel, that provides improved PDAF performance for a device having a camera or other image capture device.

In some cases, PDAF pixels (i.e., pixels configured to collect PDAF information) may have a metal shield configuration. A metal shield pixel may include a microlens that focuses incoming light on a photodiode, which photodiode in turn converts photons into electron (or hole) pairs. The collected electrons (for electron collection devices) or holes (for hole collection devices) may be converted into an analog voltage through a pixel source follower (SF) transistor amplifier. The analog voltage may then be converted to a digital signal by an analog-to-digital converter (ADC). A metal shield (e.g., a Tungsten (W) or Copper/Aluminum (Cu/Al) metal shield) may cover half of the photodiode (e.g., a left half or a right half). For a left-shielded pixel, light from left-incident angles is blocked by the metal shield, and only light approaching the pixel from right-incident angles is received by the photodiode. A right-shielded pixel functions in the opposite manner. The angular sensitivity of left and right metal shield pixels can be used to generate PDAF information.

Because the signal (e.g., the analog voltage or digital signal) generated by a metal shield pixel will be much lower than the signal generated by an unshielded (or regular) pixel, metal-shielded pixels need to be treated as defective pixels, and their signals need to be corrected before being used to generate an image. To minimize the effect that signal correction may have on image quality, metal shield pixels (or pairs of left/right-shielded pixels) may be sparsely distributed over the surface of an image sensor. That is, a relatively small number of an image sensor's pixels (e.g., 3-4%) may be configured as left or right-shielded pixels. In one example, for every eight rows and eight columns of pixels (e.g., for every block of 64 pixels in a pixel array), one left-shielded pixel and one right-shielded pixel may be provided.

At a vertical edge within an image (e.g., at an edge defined by a perceptible edge between objects, or at an edge defined by different colors or brightness (e.g., an edge between dark and light regions)), left and right-shielded pixels will have disparate signals (e.g., signals not matched in magnitude and/or polarity) when an image is not in focus, but will have well-matched signals when an image is in focus. The signals of left and right-shielded pixels therefore provide PDAF information that can be used by an auto-focus (AF) mechanism to adjust the position of one or more optical components (e.g., a lens) or an image sensor, and thereby adjust the focus of an image on the image sensor. In some cases, an image may be brought into focus based on a PDAF information obtained during a single image capture frame. By analyzing PDAF information obtained during each image capture frame, images may be quickly and continuously focused on an image sensor.

In some embodiments, left and right-shielded pixels may be fabricated without metal shields by placing both pixels adjacent one another under a single microlens. Each pixel has its own photodiode, and there may be implant isolation or physical trench isolation between the photodiodes of the two pixels. Because of the nature (e.g., curvature) of the microlens, light from left-incident angles is received mainly by the left-side pixel, and light from right-incident angles is received mainly by the right-side pixel. As a result, left and right-side pixels placed adjacent one another under a single microlens may function similarly to left and right metal shielded pixels. In a Bayer pattern pixel configuration (i.e., a repetitive 2×2 pattern including red pixels and blue pixels along one diagonal, and green pixels along the other diagonal), one blue pixel in every 8×8 block of pixels may be replaced by a green pixel (or may be modified to function as a green pixel), so that two adjacent green pixels may be placed under a single microlens to provide PDAF information. The signals of both pixels need to be corrected before being used to generate an image.

Because the signals provided by metal shield pixels, or the signals provided by adjacent pixels under a microlens, need to be corrected before being used to generate an image, the density of such pixels may be kept low. However, this provides limited PDAF information, which in turn degrades AF performance (especially in low light conditions). To improve PDAF performance, each pixel in a pixel array may be divided into left and right sub-pixels, and PDAF information may be obtained from each pixel. Also, because all pixels are implemented in a similar manner, the sub-pixel signals for each pixel may be combined in a similar way, or signal corrections may be made to each pixel in a similar way, to increase the confidence level that pixel signals are being generated or corrected appropriately (especially in low light conditions). However, the PDAF information provided by such a pixel array (and by all pixel arrays using metal shield pixels or adjacent pixels under a single microlens) bases image focus entirely on vertical edges. For an image containing few vertical edges or more horizontal edges, or for an image acquired under a low light condition, PDAF performance may suffer. For example, it may be difficult or impossible to focus an image on an image sensor, or it may take longer than desired to focus an image on an image sensor.

The present disclosure describes a pixel having a 2×2 array of sub-pixels (e.g., photodetectors) disposed under a microlens. In some embodiments, the entirety of a pixel array may incorporate such pixels. The pixels can be used, in various embodiments or configurations, to provide PDAF information based on edges having more than one orientation (e.g., vertical and horizontal edges), to improve PDAF performance (especially in low light conditions), to reduce or eliminate the need for signal correction, or to increase the resolution of an image sensor.

In one embodiment, a pixel described herein may include an imaging area and a microlens, and may be associated with a set of charge transfer transistors and a shared readout circuit. The imaging area may include a two-dimensional array of photodetectors, with each photodetector (or each photodetector in a subset of photodetectors) being electrically isolated from each other photodetector. The microlens may be disposed over the array of photodetectors. The shared readout circuit may be associated with the array of photodetectors, and each charge transfer transistor may be operable to connect a photodetector in the array of photodetectors to the shared readout circuit. In some examples, charge integrated by two or four photodetectors may be read out of the pixel simultaneously and summed by the shared readout circuit. In some examples, charge integrated by different pairs of photodetectors may be read out of the pixel sequentially. In some examples, the pair of photodetectors for which charge is read out and summed may be reconfigured between image capture frames. In some examples, the charge integrated by each photodetector of the pixel may be independently read, or the charge integrated by all photodetectors of the pixel may be read out and summed.

These and other embodiments are discussed below with reference to FIGS. 1-12. However, those skilled in the art will readily appreciate that the detailed description given herein with respect to these figures is for explanatory purposes only and should not be construed as limiting.

Directional terminology, such as "top", "bottom", "front", "back", "over", "under", "left", "right", etc. is used with reference to the orientation of some of the components in some of the figures described below. Because components in various embodiments can be positioned in a number of different orientations, directional terminology is used for purposes of illustration only and is in no way limiting. The directional terminology is intended to be construed broadly, and therefore should not be interpreted to preclude components being oriented in different ways.

Referring now to FIGS. 1A-1B, there are shown front and rear views of an electronic device 100 that includes one or more image capture devices (e.g., cameras). The electronic device 100 includes a first camera 102, a second camera 104, an enclosure 106, a display 110, an input/output (I/O) member 108, and a flash 112 or light source for the second camera 104. Each of the first camera 102 and second camera 104 may be associated with a respective image sensor. The electronic device 100 may also include one or more internal components (not shown) typical of a computing or electronic device, such as, for example, one or more processors, memory components, network interfaces, and so on.

In the illustrated embodiment, the electronic device 100 is implemented as a smartphone. Other embodiments, however, are not limited to this construction. Other types of computing or electronic devices which may include a camera or image sensor include, but are not limited to, a netbook or laptop computer, a tablet computer, a digital camera, a scanner, a video recorder, a watch (or other wearable electronic device), a drone, a vehicle navigation system, and so on.

As shown in FIGS. 1A-1B, the enclosure 106 may form an outer surface or partial outer surface and protective case for the internal components of the electronic device 100, and may at least partially surround the display 110. The enclosure 106 may be formed of one or more components operably connected together, such as a front piece and a back piece. Alternatively, the enclosure 106 may be formed of a single piece operably connected to the display 110.

The I/O member 108 may be implemented with any type of input or output member. By way of example only, the I/O member 108 may be a switch, a button, a capacitive sensor, or other input mechanism. The I/O member 108 allows a user to interact with the electronic device 100. For example, the I/O member 108 may be a button or switch to alter the volume, return to a home screen, and the like. The electronic device may include one or more input members or output members, and each member may have a single input, output, or I/O function, or some members may have multiple I/O functions. In some embodiments, the I/O member 108 may be incorporated into the display 110, the first camera 102, or an audio I/O member.

The display 110 may be operably or communicatively connected to the electronic device 100. The display 110 may be implemented as any suitable type of display, such as a high resolution display or an active matrix color liquid crystal display (LCD). The display 110 may provide a visual output for the electronic device 100 or function to receive user inputs to the electronic device 100 (or provide user outputs from the electronic device 100). For example, the display 110 may display images captured by the first camera 102 or the second camera 104. In some embodiments, the display 110 may include a multi-touch capacitive sensing touchscreen that is operable to detect one or more user inputs.

FIG. 2 shows an example embodiment of an image capture device (e.g., a camera 200), including an image sensor 202, a lens 204, and an auto-focus mechanism 206. In some embodiments, the components shown in FIG. 2 may be associated with the first camera 102 or the second camera 104 shown in FIGS. 1A-1B.

The image sensor 202 may include a plurality of pixels, such as a plurality of pixels arranged in a two-dimensional array. Multiple ones (or all) of the pixels may each include a two-dimensional array of sub-pixels (e.g., a 2×2 array of sub-pixels), with each sub-pixel including a photodetector. Having a majority (or more significantly at least 80%, and preferably all) of the pixels configured to include a 2×2 array of sub-pixels can help improve PDAF performance and/or reduce or eliminate the need to correct the outputs of PDAF-capable pixels in relation to the outputs of other pixels. The sub-pixels (or photodetectors) associated with a pixel may be electrically isolated from each other, but disposed under a shared microlens for the pixel.

The lens 204 may be adjustable with respect to the image sensor 202, to focus an image of a scene 208 on the image sensor 202. In some embodiments, the lens 204 may be moved with respect to the image sensor 202 (e.g., moved to change a distance between the lens 204 and the image sensor 202, moved to change an angle between a plane of the lens 204 and a plane of the image sensor 202, and so on). In other embodiments, the image sensor 202 may be moved with respect to the lens 204.

In some embodiments, the auto-focus mechanism 206 may include (or the functions of the auto-focus mechanism 206 may be provided by) a processor. The auto-focus mechanism 206 may receive signals from the image sensor 202 and, in response to the signals, adjust a focus setting of the camera 200. In some embodiments, the signals may include PDAF information. The PDAF information may include both horizontal phase detection signals and vertical phase detection signals. In response to the PDAF information (e.g., in response to an out-of-focus condition identified from the PDAF information), the auto-focus mechanism 206 may adjust a focus setting of the camera 200 by, for example, adjusting a relationship between the image sensor 202 (or plurality of pixels) and the lens 204 (e.g., by adjusting a physical position of the lens 204 or the image sensor 202).

Figure 3:
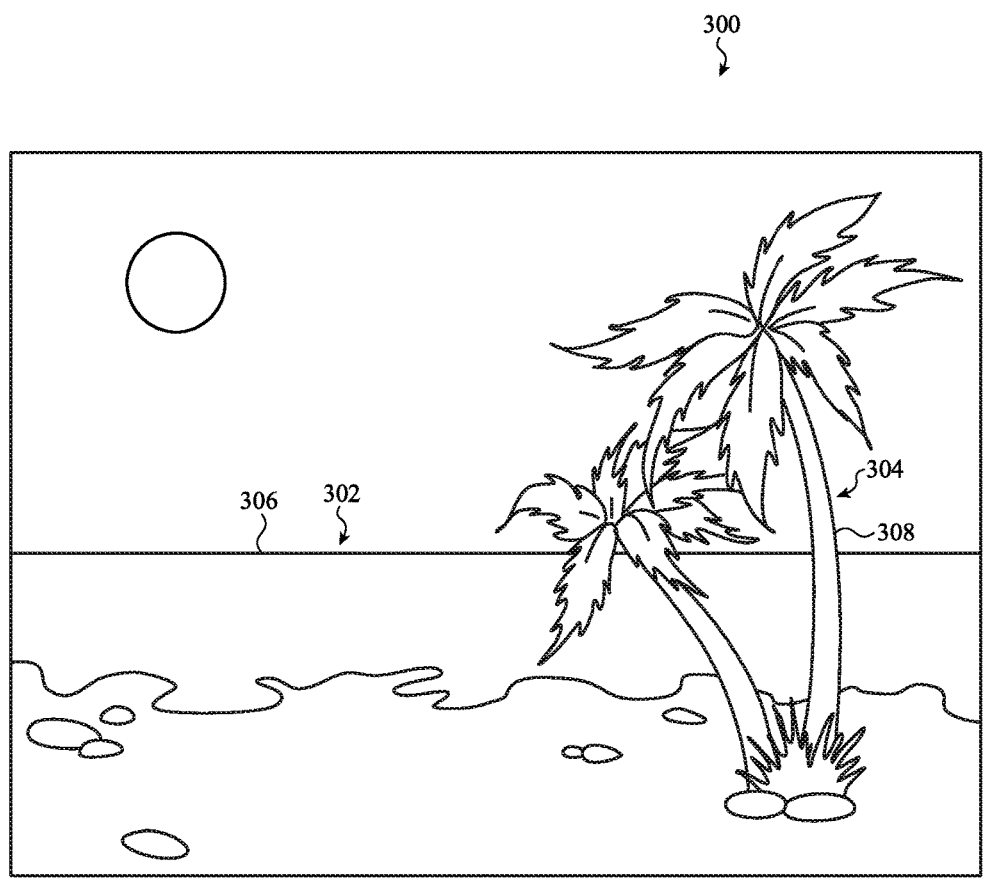
FIG. 3 shows an example of an image that may be captured by a camera.

Referring now to FIG. 3, there is shown an example of an image 300 that may be captured by an image capture device, such as one of the cameras described with reference to FIG. 1A-1B or 2. The image 300 may include a number of objects 302, 304 having edges 306, 308 oriented in one or more directions. The edges 306, 308 may include perceptible edges between objects, or edges defined by different colors or brightness (e.g., an edge between dark and light regions). In some embodiments, the camera may detect a focus of both a first set of edges (e.g., horizontal edges) and a second set of edges (e.g., vertical edges, or edges that are orthogonal to the first set of edges).

The focus of the first and second sets of edges may be detected in the same or different image capture frames, using the same or different pixels. In some cases, a focus of edges in the first set of edges may be detected using a first subset of pixels configured to detect a focus of horizontal edges, in a same frame that a focus of edges in the second set of edges is detected by a second subset of pixels configured to detect a focus of vertical edges. In another frame, a focus of edges in the second set of edges may be detected by the first subset of pixels, and a focus of edges in the first set of edges may be detected by the second subset of pixels. In other cases, a focus of edges in the first set may be detected by up to all of the pixels in an image sensor in a first image capture frame, and a focus of edges in the second set may be detected by up to all of the pixels in the image sensor in a second image capture frame. A focus of edges may be detected based on a phase difference (e.g., magnitude and polarity of the phase difference) in light captured by different sub-pixels (e.g., different photodetectors) associated with a pixel.

In some embodiments, a single pixel in a pixel array (and in some cases, some or each of the pixels in the pixel array, or each of the pixels in a subset of pixels in the pixel array) may be reconfigured between image capture frames, or at other times, to produce a signal usable for detecting the focus of a horizontal edge, a vertical edge, or a diagonal edge. In some embodiments, all of the pixels in a pixel array (or all of the pixels used to capture a particular image) may be employed in the detection of edge focus information for an image.

Figure 4:
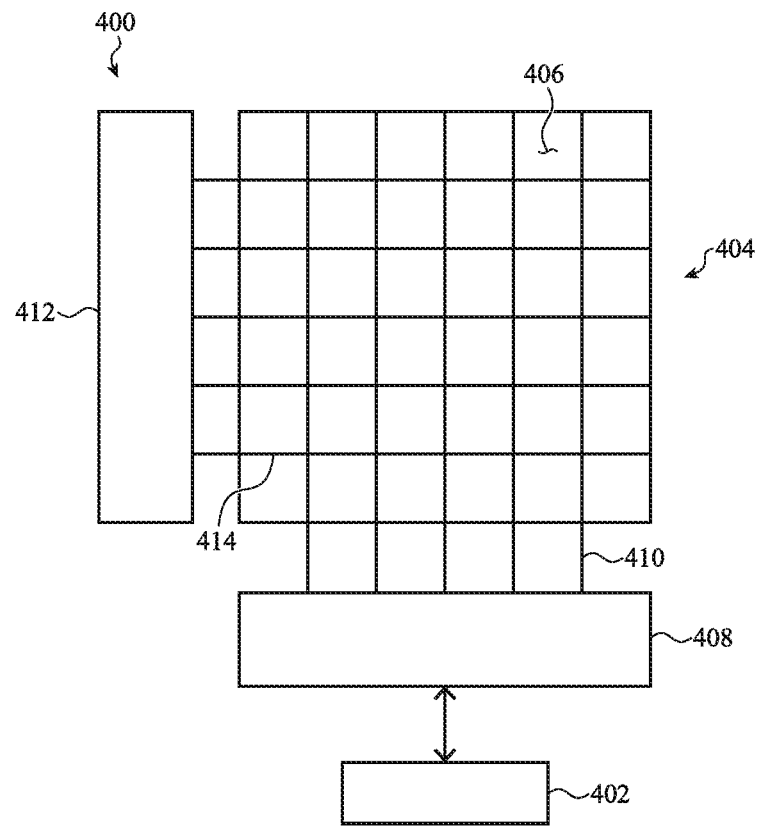
FIG. 4 shows a plan view of one example of an image sensor.

FIG. 4 shows a plan view of one example of an image sensor 400, such as an image sensor associated with one of the image capture devices or cameras described with reference to FIGS. 1A-1B and 2. The image sensor 400 may include an image processor 402 and an imaging area 404. The imaging area 404 may be implemented as a pixel array that includes a plurality of pixels 406. The pixels 406 may be same colored pixels (e.g., for a monochrome imaging area 404) or differently colored pixels (e.g., for a multi-color imaging area 404). In the illustrated embodiment, the pixels 406 are arranged in rows and columns. However, other embodiments are not limited to this configuration. The pixels in a pixel array may be arranged in any suitable configuration, such as, for example, a hexagonal configuration.

The imaging area 404 may be in communication with a column select circuit 408 through one or more column select lines 410, and with a row select circuit 412 through one or more row select lines 414. The row select circuit 412 may selectively activate a particular pixel 406 or group of pixels, such as all of the pixels 406 in a certain row. The column select circuit 408 may selectively receive the data output from a selected pixel 406 or group of pixels 406 (e.g., all of the pixels in a particular row).

The row select circuit 412 and/or column select circuit 408 may be in communication with an image processor 402. The image processor 402 may process data from the pixels 406 and provide that data to another processor (e.g., a system processor) and/or other components of a device (e.g., other components of the electronic device 100). In some embodiments, the image processor 402 may be incorporated into the system. The image processor 402 may also receive focus information (e.g., PDAF information) from some or all of the pixels, and may perform a focusing operation for the image sensor 400. In some examples, the image processor 402 may perform one or more of the operations performed by the auto-focus mechanism described with reference to FIG. 2.

Figure 5:
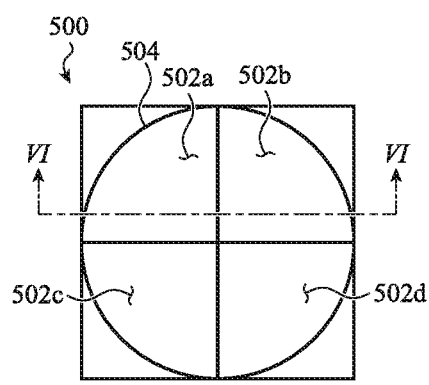
FIG. 5 shows an example imaging area (e.g., a plan view) of a pixel in an image sensor.

FIG. 5 shows an example imaging area (e.g., a plan view) of a pixel 500 in an image sensor, such as a pixel included in an image sensor associated with one of the image capture devices or cameras described with reference to FIGS. 1A-1B and 2, or a pixel included in the image sensor described with reference to FIG. 4. In some embodiments, some pixels in an image sensor, each pixel in an image sensor, or each pixel in a subset of pixels in an image sensor, may be configured as shown in FIG. 5.

The imaging area of the pixel 500 includes a two-dimensional array of photodetectors 502 or sub-pixels (e.g., an array of sub-pixels, with each sub-pixel including a photodetector 502). In some embodiments, the imaging area may include a 2×2 array of sub-pixels or photodetectors (e.g., a set of photodetectors 502 arranged in two rows and two columns). For example, the array may include a first photodetector 502a and a second photodetector 502b arranged in a first row, and a third photodetector 502c and a fourth photodetector 502d arranged in a second row. The first photodetector 502a and the third photodetector 502c may be arranged in a first column, and the second photodetector 502b and the fourth photodetector 502d may be arranged in a second column.

Each photodetector 502 may be electrically isolated from each other photodetector 502 (e.g., by implant isolation or physical trench isolation). A microlens 504 may be disposed over the array of photodetectors 502. An optional same color light filter (e.g., a red filter, a blue filter, a green filter, or the like) may also be disposed over the array of photodetectors 502. In some examples, the light filter may be applied to an interior or exterior of the microlens 504. In some examples, the microlens may be tinted to provide the light filter. In some examples, each of the photodetectors may be separately encapsulated under the microlens 504, and the light filter may be applied to or in the encapsulant. In some examples, a light filter element may be positioned between the photodetectors 502 and the microlens 504 (although other configurations of the light filter may also be considered as being disposed "between" the photodetectors 502 and the microlens 504).

The photodetectors 502 may be connected to a shared readout circuit (i.e., a readout circuit shared by all of the photodetectors 502 associated with the pixel 500). A set of charge transfer transistors may be operable to connect the photodetectors 502 to the shared readout circuit (e.g., each charge transfer transistor in the set may be operable (e.g., by a processor) to connect a respective one of the photodetectors 502 to, and disconnect the respective one of the photodetectors 502 from, the shared readout circuit; alternatively, a charge transfer transistor may be statically configured to connect/disconnect a pair of the photodetectors 502 to/from the shared readout circuit). In some cases, each charge transfer transistor may be operated individually. In other cases, the charge transfer transistors may be statically configured for pair-wise operation.

Figure 6:
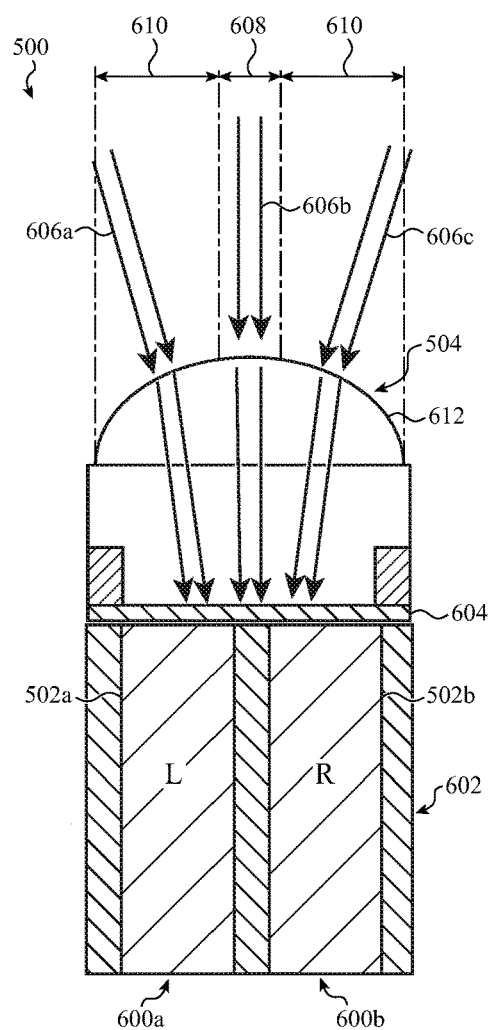
FIG. 6 shows an example cross-section of the pixel shown in FIG. 5.

FIG. 6 shows an example cross-section of the pixel 500 shown in FIG. 5. By way of example, the cross-section is taken through the first row of photodetectors 502 shown in FIG. 5. Cross-sections through the second row, the first column, and the second column may be configured similarly to the cross-section shown in FIG. 6.

A first sub-pixel 600a may include the photodetector 502a, and a second sub-pixel 600b may include the photodetector 502b. The first and second photodetectors 502a, 502b may be formed in a substrate 602. The substrate 602 may include a semiconductor-based material, such as, but not limited to, silicon, silicon-on-insulator (SOI), silicon-on-sapphire (SOS), doped and undoped semiconductor regions, epitaxial layers formed on a semiconductor substrate, well regions or buried layers formed in a semiconductor substrate, or other semiconductor structures.

The microlens 504 may be disposed over part or all of both of the photodetectors 502a, 502b (as well as part or all of the photodetectors 502c and 502d). The microlens 504 may be formed of any material or combination of materials that is translucent to at least one wavelength of light. The microlens may have a light-receiving side 612 opposite the array of photodetectors 502. The light-receiving side 612 of the microlens 504 may include a central portion 608 and a peripheral portion 610. The peripheral portion 610 may be configured to redirect at least a portion of light incident on the peripheral portion (e.g., the light 606a or light 606c) toward a corresponding peripheral portion of the imaging area that includes the photodetectors 502 (e.g., the light 606a may be redirected toward the photodetector 502a, and the light 606c may be redirected toward the photodetector 502b). In some embodiments, the microlens 504 may have a convex-shaped or dome-shaped light-receiving surface (or exterior surface).

The microlens 504 may be configured to focus incident light 606 received from different angles on different ones or both of the photodetectors 502a, 502b. For example, light 606a incident on the microlens 504 from a left side approach angle may be focused more (or solely) on the left side photodetector 502a, and thus the left side photodetector 502a may accumulate more charge than the right side photodetector 502b, making the signal response of the left side sub-pixel 600a greater than the signal response of the right side sub-pixel 600b. Similarly, light 606c incident on the microlens 504 from a right side approach angle may be focused more (or solely) on the right side photodetector 502b, and thus the right side photodetector 502b may accumulate more charge than the left side photodetector 502a, making the signal response of the right side sub-pixel 600b greater than the signal response of the left side sub-pixel 600a. Light 606b incident on the microlens 504 from the front center (or top) of the microlens 504 may be focused on both of the photodetectors 502a, 502b, making the signal response of the left and right side sub-pixels 600a, 600b about equal.

An optional same color light filter 604 (e.g., a red filter, a blue filter, a green filter, or the like) may be disposed over each of the photodetectors 502a, 502b (as well as the photodetectors 502c and 502d).

Figure 7:
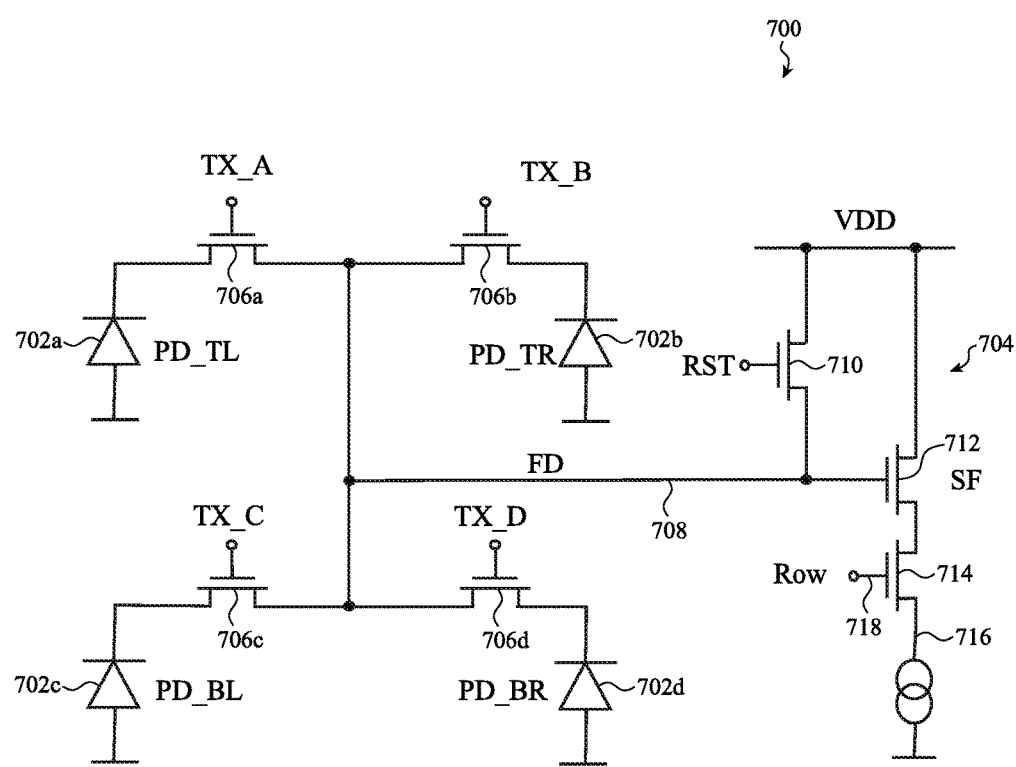
FIG. 7 shows a simplified schematic of a pixel usable in an image sensor.

Referring now to FIG. 7, there is shown a simplified schematic of a pixel 700 (and associated shared readout circuit 704) usable in an image sensor. In some embodiments, the pixel 700 may be an example of a pixel included in an image sensor associated with one of the image capture devices or cameras described with reference to FIGS. 1A-1B and 2, or a pixel included in the image sensor described with reference to FIG. 4, or the pixel described with reference to FIGS. 5-6. In some embodiments, some pixels in an image sensor, each pixel in an image sensor, or each pixel in a subset of pixels in an image sensor, may be configured as shown in FIG. 7, and the shared readout circuit 704 for the pixel 700 may be part of an overall pixel readout circuit for an image sensor.

The pixel 700 may include a two-dimensional array of photodetectors 702, with each photodetector 702 being selectively connectable to (and disconnectable from) the shared readout circuit 704 by a respective charge transfer transistor in a set of charge transfer transistors 706. In some embodiments, the two-dimensional array of photodetectors 702 may include a 2×2 array of photodetectors (e.g., an array of photodetectors 702 arranged in two rows and two columns). For example, the array may include a first photodetector 702a (PD_TL) and a second photodetector 702b (PD_TR) arranged in a first row, and a third photodetector 702c (PD_BL) and a fourth photodetector 702d (PD_BR) arranged in a second row. The first photodetector 702a and the third photodetector 702c may be arranged in a first column, and the second photodetector 702b and the fourth photodetector 702d may be arranged in a second column. As described with reference to FIGS. 5 and 6, the photodetectors 702 may be disposed (positioned) in a 2×2 array under a microlens.

The shared readout circuit 704 may include a sense region 708, a reset (RST) transistor 710, a readout transistor 712, and a row select (RS) transistor 714. The sense region 708 may include a capacitor that temporarily stores charge received from one or more of the photodetectors 702. As described below, charge accumulated by one or more of the photodetectors 702 may be transferred to the sense region 708 by applying a drive signal (e.g., a gate voltage) to one or more of the charge transfer transistors 706. The transferred charge may be stored in the sense region 708 until a drive signal applied to the reset (RST) transistor 710 is pulsed.

Each of the charge transfer transistors 706 may have one terminal connected to a respective one of the photodetectors 702 and another terminal connected to the sense region 708. One terminal of the reset transistor 710 and one terminal of the readout transistor 712 may be connected to a supply voltage (e.g., VDD) 514. The other terminal of the reset transistor 710 may be connected to the sense region 708, while the other terminal of the readout transistor 712 may be connected to a terminal of the row select transistor 714. The other terminal of the row select transistor 714 may be connected to an output line 716.

By way of example only, and in one embodiment, each of the photodetectors 702 may be implemented as a photodiode (PD) or pinned photodiode, the sense region 708 may be implemented as a floating diffusion (FD) node, and the readout transistor 712 may be implemented as a source follower (SF) transistor. The photodetectors 702 may be electron-based photodiodes or hole-based photodiodes. The term photodetector is used herein to refer to substantially any type of photon or light detecting component, such as a photodiode, pinned photodiode, photogate, or other photon sensitive region. Additionally, the term sense region, as used herein, is meant to encompass substantially any type of charge storing or charge converting region.

In some embodiments, the pixel 700 may be implemented using additional or different components. For example, the row select transistor 714 may be omitted and a pulsed power supply may be used to select the pixel.

When an image is to be captured, an integration period for the pixel begins and the photodetectors 702 accumulate photo-generated charge in response to incident light. When the integration period ends, the accumulated charge in some or all of the photodetectors 702 may be transferred to the sense region 708 by sequentially or simultaneously applying drive signals to (e.g., by pulsing gate voltages of) the charge transfer transistors 706. Typically, the reset transistor 710 is used to reset the voltage on the sense region 708 to a predetermined level prior to the transfer of charge from a set of one or more photodetectors 702 to the sense region 708. When charge is to be read out of the pixel 700, a drive signal may be applied to the row select transistor 714 (e.g., a gate voltage of the row select transistor 714 may be pulsed) via a row select line 718 coupled to row select circuitry, and charge from one, two, or any number of the photodetectors 702 may be read out over an output line 716 coupled to column select circuitry. The readout transistor 712 senses the voltage on the sense region 708, and the row select transistor 714 transfers an indication of the voltage to the output line 716. The column select circuitry may be coupled to an image processor, auto-focus mechanism, or combination thereof.

In some embodiments, a processor may be configured to operate the set of charge transfer transistors 706 to simultaneously transfer charge from multiple photodetectors 702 (e.g., a pair of photodetectors) to the sense region 708 or floating diffusion node. For example, the gates of first and second charge transfer transistors 706a (TX_A) and 706b (TX_B) (i.e., the charge transfer transistors of the first row) may be simultaneously driven to transfer charges accumulated by the first and second photodetectors 702a, 702b to the sense region 708, where the charges may be summed. After reading the summed charge out of the pixel 700, the gates of third and fourth charge transfer transistors 706c (TX_C) and 706d (TX_D) (i.e., the charge transfer transistors of the second row) may be simultaneously driven to transfer charges accumulated by the third and fourth photodetectors 702c, 702d to the sense region 708, where the charges may be summed. This summed charge may also be read out of the pixel 700. In a subsequent frame of image capture, the gates of the first and third charge transfer transistors 706a and 706c (i.e., the charge transfer transistors of the first column) may be simultaneously driven to transfer charges accumulated by the first and third photodetectors 702a, 702c to the sense region 708. After reading this charge out of the pixel 700, the gates of the second and fourth charge transfer transistors 706b and 706d (i.e., the charge transfer transistors of the second column) may be simultaneously driven to transfer charges accumulated by the second and fourth photodetectors 702b, 702d to the sense region 708. This charge may also be read out of the pixel 700. Additionally or alternatively, charge accumulated by the photodetectors 702 may be read out of the pixel 700 individually, or charges accumulated by any combination (including all) of the photodetectors 702 may be read out of the pixel 700 together, or charges accumulated by the photodetectors 702 along a left or right-sloping diagonal may be read out of the pixel 700 together.

When charges accumulated by different photodetectors 702 are read out of the pixel 700 individually, the charges may be summed in various ways, or a processor may interpolate between the values read out of the same colored sub-pixels in different pixels of a pixel array to generate an image having an effective 4× resolution for the pixel array.

In some embodiments, a shared readout circuit per pixel may be configured differently for different pixels in a pixel array. For example, in a potentially lower cost image sensor, or in an image sensor implemented using front side illumination (FSI) technology, a single charge transfer transistor may be coupled to a pair of photodetectors, and may be operated by a processor to simultaneously read charges out of, and sum charges, integrated by a pair of photodetectors. For example, in one pixel of an image sensor, a single charge transfer transistor could replace both of the charge transfer transistors 706a and 706b and connect both of the photodiodes 702a and 702b to the shared readout circuit 704, and another charge transfer transistor could replace both of the charge transfer transistors 706c and 706d and connect both of the photodiodes 702c and 702d to the shared readout circuit 704. Similarly, in another pixel of the image sensor, a single charge transfer transistor could replace both of the charge transfer transistors 706a and 706c and connect both of the photodiodes 702a and 702c to the shared readout circuit 704, and another charge transfer transistor could replace both of the charge transfer transistors 706b and 706d and connect both of the photodiodes 702b and 702d to the shared readout circuit 704.

In some embodiments, an image capture device, such as a camera, may not include a shutter, and thus an image sensor of the image capture device may be constantly exposed to light. When the pixel 700 is used in these embodiments, the photodetectors 702 may have to be reset or depleted of charge before an image is captured (e.g., by applying drive signals (e.g., gate voltages) to the reset transistor 710 and charge transfer transistors 706). After the charge from the photodetectors 702 has been depleted, the charge transfer transistors 706 and reset transistor 710 may be turned off to isolate the photodetectors 702 from the shared readout circuit 704. The photodetectors 702 can then accumulate photon-generated charge during a charge integration period.

Figure 8:
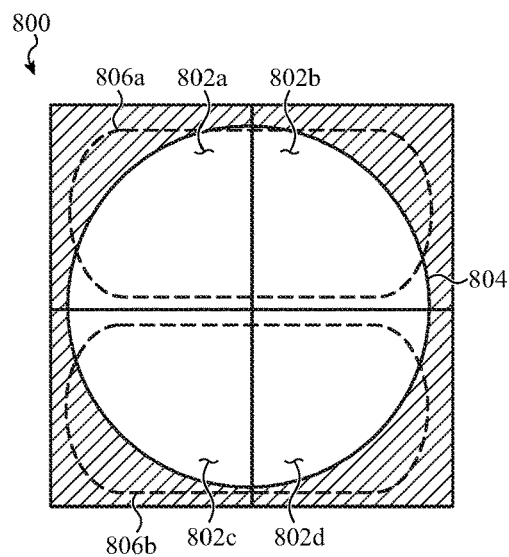
FIG. 8 shows a pixel configured for detection of horizontal edge focus.

FIG. 8 shows a pixel 800 configured for detection of horizontal edge focus. The pixel 800 may be an example of a pixel included in an image sensor associated with one of the image capture devices or cameras described with reference to FIGS. 1A-1B and 2, or a pixel included in the image sensor described with reference to FIG. 4, or the pixel described with reference to any of FIGS. 5-7.

The imaging area of the pixel 800 includes a two-dimensional array of photodetectors 802 or sub-pixels (e.g., an array of sub-pixels with each sub-pixel including a photodetector 802). For example, the array may include a first photodetector 802a and a second photodetector 802b arranged in a first row, and a third photodetector 802c and a fourth photodetector 802d arranged in a second row. The first photodetector 802a and the third photodetector 802c may be arranged in a first column, and the second photodetector 802b and the fourth photodetector 802d may be arranged in a second column.

Each photodetector 802 may be electrically isolated from each other photodetector 802 (e.g., by implant isolation or physical trench isolation). A microlens 804 may be disposed over the array of photodetectors 802. An optional same color light filter (e.g., a red filter, a blue filter, a green filter, or the like) may also be disposed over the array of photodetectors 802.

The photodetectors 802 may be connected to a shared readout circuit (i.e., a readout circuit shared by all of the photodetectors 802 associated with the pixel 800, as described, for example, with reference to FIG. 7). A set of charge transfer transistors may be operable to connect the photodetectors 802 to the shared readout circuit (e.g., each charge transfer transistor in the set may be operable (e.g., by a processor) to connect a respective one of the photodetectors 802 to, and disconnect the respective one of the photodetectors 802 from, the shared readout circuit). In some cases, each charge transfer transistor may be operated individually.

As indicated by the broken lines 806a and 806b, the charge transfer transistors may be operated (e.g., by a processor) to read a sum of the charges accumulated by the first and second photodetectors 802a, 802b out of the pixel 800, and then operated to read a sum of the charges accumulated by the third and fourth photodetectors 802c, 802d out of the pixel 800. In some embodiments, the summed charges may be compared to detect a phase difference in the charges, and to perform a PDAF operation based on horizontal edge focus detection. The summed charges may also or alternatively summed to obtain a pixel value. In some embodiments, the summed charges may be summed without correction to obtain the pixel value.

Figure 9:
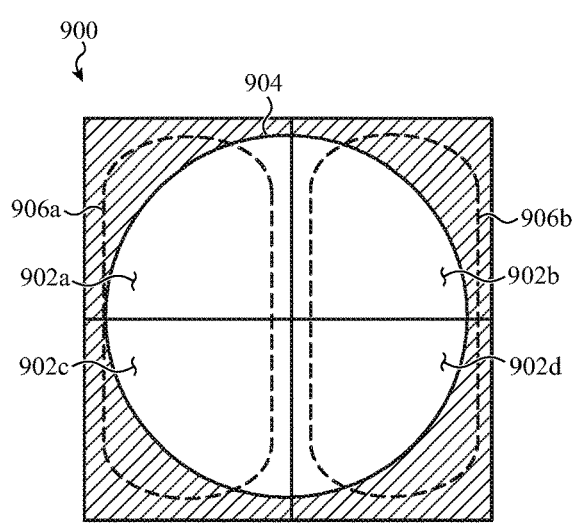
FIG. 9 shows a pixel configured for detection of vertical edge focus.

FIG. 9 shows a pixel 900 configured for detection of vertical edge focus. The pixel 900 may be an example of a pixel included in an image sensor associated with one of the image capture devices or cameras described with reference to FIGS. 1A-1B and 2, or a pixel included in the image sensor described with reference to FIG. 4, or the pixel described with reference to any of FIGS. 5-8.

The imaging area of the pixel 900 includes a two-dimensional array of photodetectors 902 or sub-pixels (e.g., an array of sub-pixels with each sub-pixel including a photodetector 902). For example, the array may include a first photodetector 902a and a second photodetector 902b arranged in a first row, and a third photodetector 902c and a fourth photodetector 902d arranged in a second row. The first photodetector 902a and the third photodetector 902c may be arranged in a first column, and the second photodetector 902b and the fourth photodetector 902d may be arranged in a second column.

Each photodetector 902 may be electrically isolated from each other photodetector 902 (e.g., by implant isolation or physical trench isolation). A microlens 904 may be disposed over the array of photodetectors 902. An optional same color light filter (e.g., a red filter, a blue filter, a green filter, or the like) may also be disposed over the array of photodetectors 902.

The photodetectors 902 may be connected to a shared readout circuit (i.e., a readout circuit shared by all of the photodetectors 902 associated with the pixel 900, as described, for example, with reference to FIG. 7). A set of charge transfer transistors may be operable to connect the photodetectors 902 to the shared readout circuit (e.g., each charge transfer transistor in the set may be operable (e.g., by a processor) to connect a respective one of the photodetectors 902 to, and disconnect the respective one of the photodetectors 902 from, the shared readout circuit). In some cases, each charge transfer transistor may be operated individually.

As indicated by the broken lines 906a and 906b, the charge transfer transistors may be operated (e.g., by a processor) to read a sum of the charges accumulated by the first and third photodetectors 902a, 902c out of the pixel 900, and then operated to read a sum of the charges accumulated by the second and fourth photodetectors 902b, 902d out of the pixel 900. In some embodiments, the summed charges may be compared to detect a phase difference in the charges, and to perform a PDAF operation based on vertical edge focus detection. The summed charges may also or alternatively summed to obtain a pixel value. In some embodiments, the summed charges may be summed without correction to obtain the pixel value. In some embodiments, a single pixel may be configured as shown in FIG. 8 for one image capture frame, and configured as shown in FIG. 9 for another image capture frame.

Figure 10A:
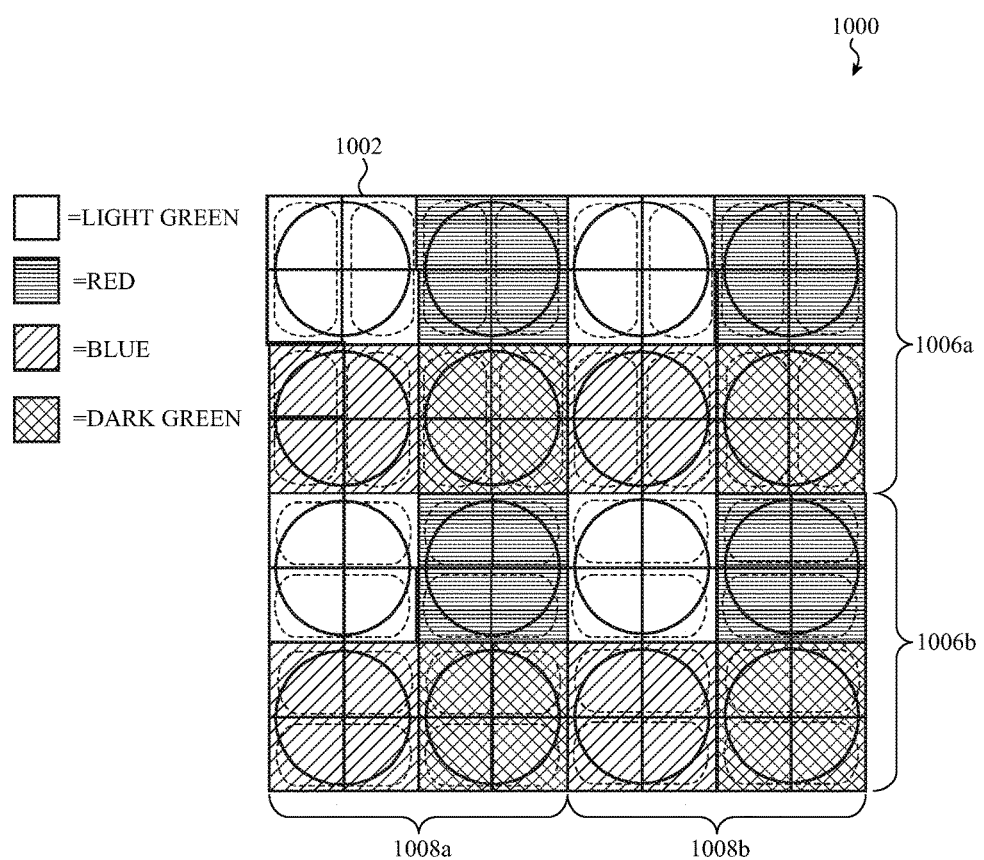
FIG. 10A-10C show an imaging area of an image sensor, in which the pixels of the image sensor are arranged in accordance with a Bayer pattern (i.e., a 2×2 pattern including red pixels and blue pixels along one diagonal, and green pixels along the other diagonal)
Figure 10B:
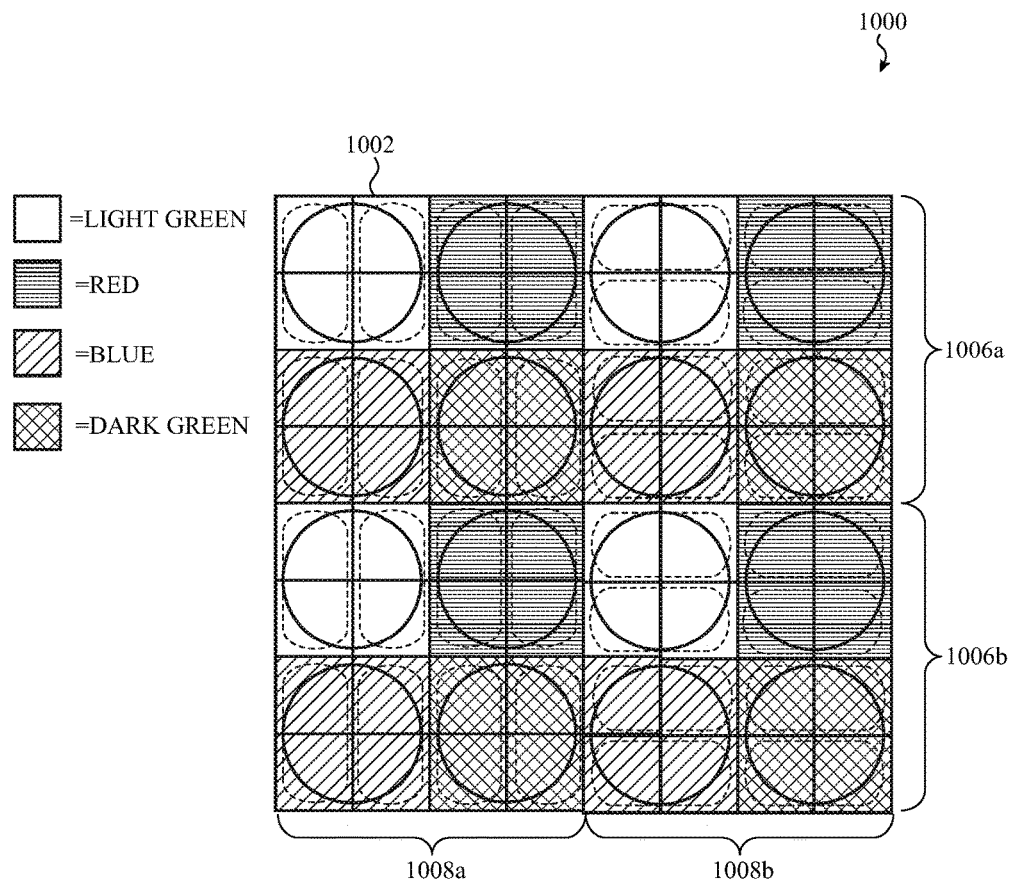
Figure 10C:
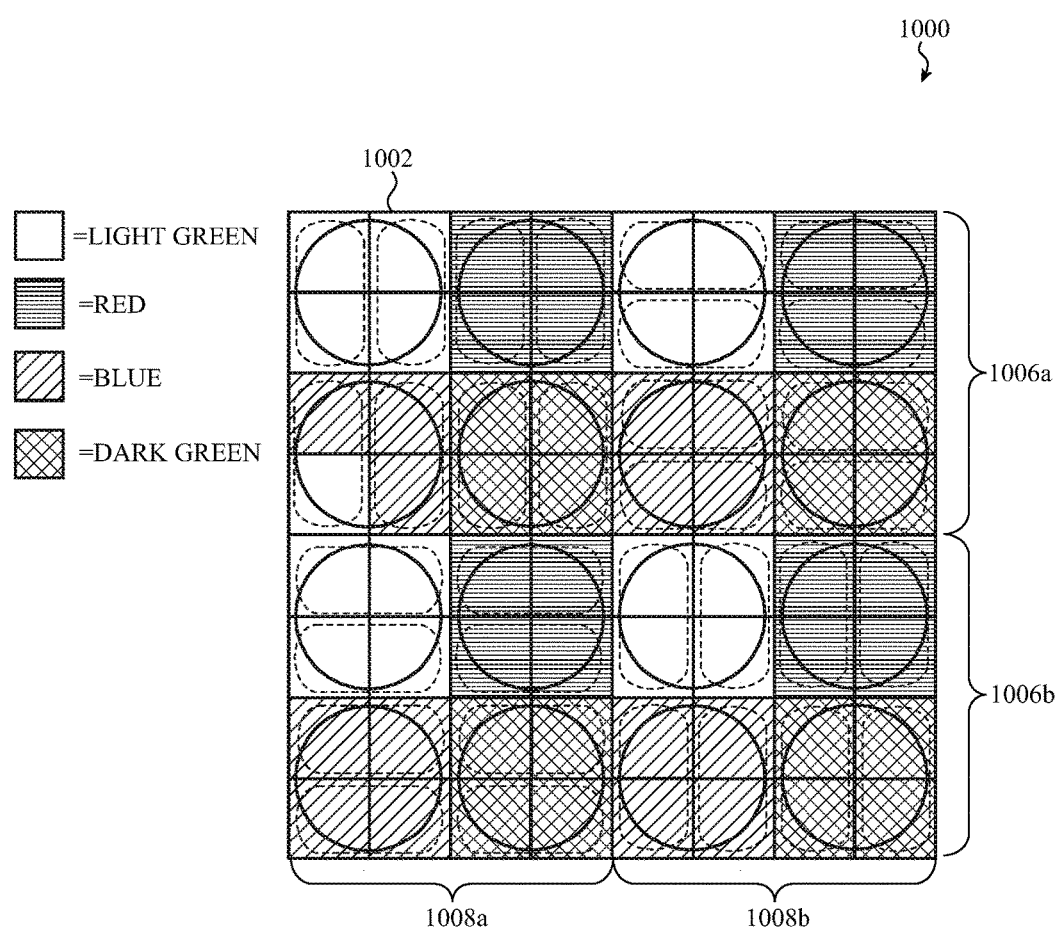

FIGS. 10A-10C show an imaging area 1000 of an image sensor, in which the pixels 1002 of the image sensor are arranged in accordance with a Bayer pattern (i.e., a 2×2 pattern including red pixels and blue pixels along one diagonal, and green pixels along the other diagonal). The pixels 1002 may be arranged in Bayer pattern rows 1006a, 1006b and Bayer pattern columns 1008a, 1008b. FIGS. 10A-10C also show each pixel 1002 as having a 2×2 array of sub-pixels 1004, with each sub-pixel 1004 including a photodetector, as described, for example, with reference to FIG. 5-9. FIGS. 10A-10C show different ways in which the readout circuits for the pixels 1002 may be configured during an image capture frame. In some embodiments, the imaging area 1000 may be an example of an imaging area of an image sensor associated with one of the image capture devices or cameras described with reference to FIGS. 1A-1B and 2, or the imaging area of the image sensor described with reference to FIG. 4, or an imaging area including a plurality of the pixels described with reference to any of FIGS. 5-9.

In FIG. 10A, the pixels 1002 in the first Bayer pattern row 1006a of the imaging area 1000 are configured (or are operable) to detect a phase difference (e.g., an out-of-focus condition) in a first set of edges of an image (e.g., vertical edges), and the pixels 1002 in the second Bayer pattern row 1006b are configured (or are operable) to detect a phase difference in a second set of edges of the image (e.g., horizontal edges, or edges that are otherwise orthogonal to the first set of edges). The configuration shown in FIG. 10A may be useful in that it simplifies signal routing per Bayer pattern row 1006. However, improved PDAF performance is only achieved by column.

In FIG. 10B, the pixels 1002 in the first Bayer pattern column 1008a of the imaging area 1000 are configured (or are operable) to detect a phase difference (e.g., an out-of-focus condition) in a first set of edges of an image (e.g., vertical edges), and the pixels 1002 in the second Bayer pattern column 1008b are configured (or are operable) to detect a phase difference in a second set of edges of the image (e.g., horizontal edges, or edges that are otherwise orthogonal to the first set of edges). The configuration shown in FIG. 10BA may be useful in that it simplifies signal routing per Bayer pattern column 1008. However, improved PDAF performance is only achieved by row.

In FIG. 10C, a first set of the pixels 1002 in each Bayer pattern row 1006 and Bayer pattern column 1008 of the imaging area 1000 is configured (or is operable) to detect a phase difference (e.g., an out-of-focus condition) in a first set of edges of an image (e.g., vertical edges), and a second set of the pixels 1002 in the each Bayer pattern row 1006 and Bayer pattern column 1008 is configured (or is operable) to detect a phase difference in a second set of edges of the image (e.g., horizontal edges, or edges that are otherwise orthogonal to the first set of edges). The configuration shown in FIG. 10C may be useful in that it improves PDAF performance by row and column. However, signal routing is more complex over the configurations described with reference to FIGS. 10A-10B.

Pixels and pixel arrays configured as described in the present disclosure may be implemented using back side illumination (BSI) technology or FSI technology, though a BSI implementation may provide more metal routing options and better enable the charge collected by each sub-pixel of a pixel to be separately read out of a pixel. When metal routing options are limited, a particular pixel in a pixel array may be statically configured as a horizontal edge detection PDAF pixel or a vertical edge detection PDAF pixel.

Figure 11:
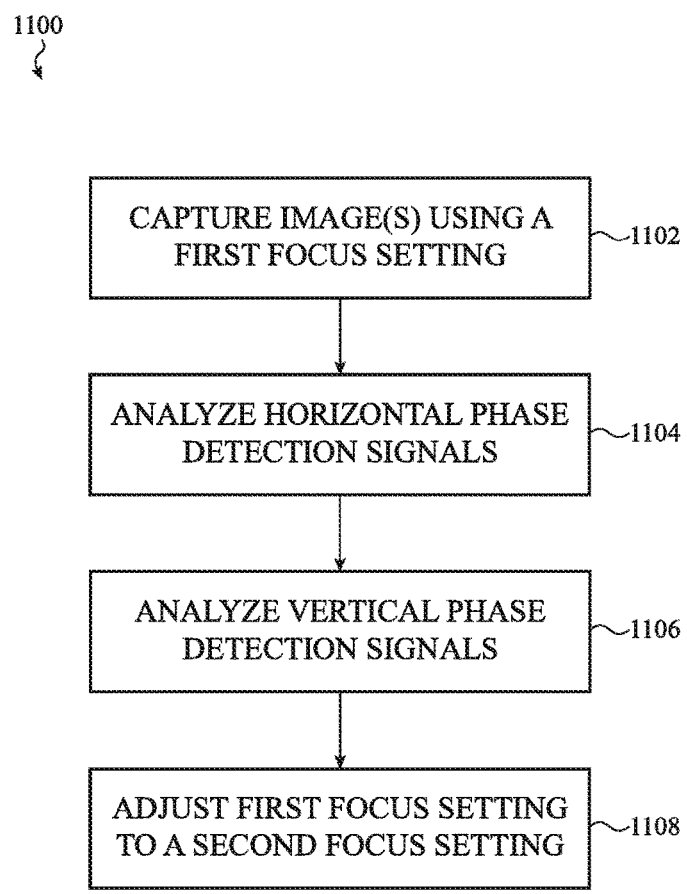
FIG. 11 shows a method of determining a focus setting for an image capture device that includes an image sensor having a plurality of pixels.

Referring now to FIG. 11, there is shown a method 1100 of determining a focus setting for an image capture device that includes an image sensor having a plurality of pixels. Some or all of the pixels (e.g., each pixel of multiple pixels) may include a two-dimensional array of photodetectors disposed under a microlens, with each photodetector of the array of photodetectors being electrically isolated from each other photodetector in the array of photodetectors. In some embodiments, the method 1100 may be performed by one of the image capture devices or cameras described with reference to FIGS. 1A-1B and 2, or an image capture device or camera including the image sensor described with reference to any of FIGS. 4 and 10A-10C, or an image capture device or camera including a plurality of the pixels described with reference to any of FIGS. 5-9.

At 1102, the method 1100 may include capturing one or more images using a first focus setting for the image capture device. The operation(s) at 1102 may be performed, for example, by the auto-focus mechanism described with reference to FIG. 2, the image processor described with reference to FIG. 4, or the processor or image processor described with reference to FIG. 12.

At 1104, the method 1100 may include analyzing horizontal phase detection signals output from a first set of the multiple pixels while capturing the one or more images. The operation(s) at 1104 may be performed, for example, by the auto-focus mechanism described with reference to FIG. 2, the image processor described with reference to FIG. 4, or the processor or image processor described with reference to FIG. 12.

At 1106, the method 1100 may include analyzing vertical phase detection signals output from a second set of the multiple pixels while capturing the one or more images. The operation(s) at 1106 may be performed, for example, by the auto-focus mechanism described with reference to FIG. 2, the image processor described with reference to FIG. 4, or the processor or image processor described with reference to FIG. 12.

At 1108, the method 1100 may include adjusting the first focus setting to a second focus setting based on the horizontal phase detection signal analysis and the vertical phase detection signal analysis. The operation(s) at 1108 may be performed, for example, by the auto-focus mechanism described with reference to FIG. 2, the image processor described with reference to FIG. 4, or the processor or image processor described with reference to FIG. 12.

In some embodiments of the method 1100, each of the first set of multiple pixels and the second set of multiple pixels may include the plurality of pixels (i.e., all of the pixels in the imaging area). In some embodiments of the method 1100, at least a first subset of the horizontal phase detection signals and at least a first subset of the vertical phase detection signals may be acquired in a single image capture frame (i.e., while capturing one images).

In some embodiments, the method 1100 may include modifying a pairing of photodetectors of at least one pixel in the multiple pixels (e.g., modifying a sub-pixel pairing of at least one pixel in the multiple pixels). The modification may occur between a first image capture frame and a second image capture (i.e., between capturing a first image and a second image). The pairing of photodetectors may determine a charge summing that occurs during a read out of charges accumulated by a pixel.

Figure 12:
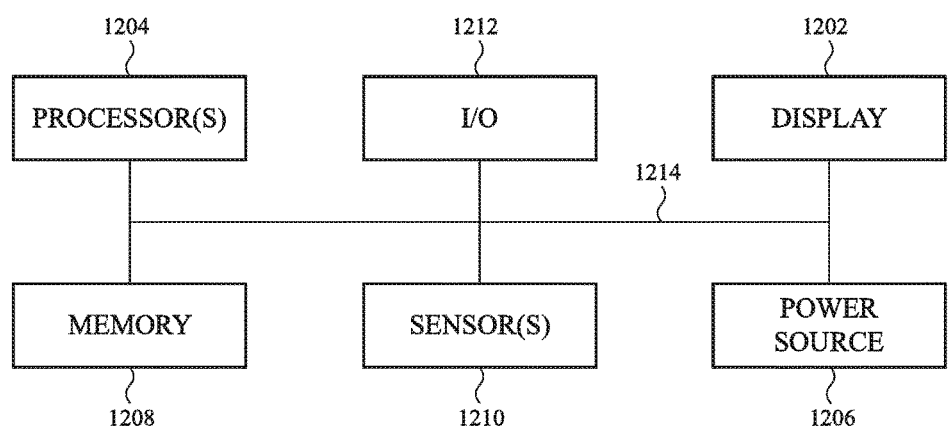
FIG. 12 shows a sample electrical block diagram of an electronic device.

FIG. 12 shows a sample electrical block diagram of an electronic device 1200, which may be the electronic device described with reference to FIG. 1. The electronic device 1200 may include a display 1202 (e.g., a light-emitting display), a processor 1204, a power source 1206, a memory 1208 or storage device, a sensor 1210, and an input/output (I/O) mechanism 1212 (e.g., an input/output device and/or input/output port). The processor 1204 may control some or all of the operations of the electronic device 1200. The processor 1204 may communicate, either directly or indirectly, with substantially all of the components of the electronic device 100. For example, a system bus or other communication mechanism 1214 may provide communication between the processor 1204, the power source 1206, the memory 1208, the sensor 1210, and/or the input/output mechanism 1212.

The processor 1204 may be implemented as any electronic device capable of processing, receiving, or transmitting data or instructions. For example, the processor 1204 may be a microprocessor, a central processing unit (CPU), an application-specific integrated circuit (ASIC), a digital signal processor (DSP), or combinations of such devices. As described herein, the term "processor" is meant to encompass a single processor or processing unit, multiple processors, multiple processing units, or other suitably configured computing element or elements.

It should be noted that the components of the electronic device 1200 may be controlled by multiple processors. For example, select components of the electronic device 1200 may be controlled by a first processor and other components of the electronic device 1200 may be controlled by a second processor, where the first and second processors may or may not be in communication with each other.

The power source 1206 may be implemented with any device capable of providing energy to the electronic device 1200. For example, the power source 1206 may be one or more batteries or rechargeable batteries. Additionally or alternatively, the power source 1206 may be a power connector or power cord that connects the electronic device 1200 to another power source, such as a wall outlet.

The memory 1208 may store electronic data that may be used by the electronic device 1200. For example, the memory 1208 may store electrical data or content such as, for example, audio and video files, documents and applications, device settings and user preferences, timing signals, control signals, data structures or databases, image data, or focus settings. The memory 1208 may be configured as any type of memory. By way of example only, the memory 1208 may be implemented as random access memory, read-only memory, Flash memory, removable memory, other types of storage elements, or combinations of such devices.

The electronic device 1200 may also include one or more sensors 1210 positioned substantially anywhere on the electronic device 1200. The sensor(s) 1210 may be configured to sense substantially any type of characteristic, such as but not limited to, pressure, light, touch, heat, movement, relative motion, biometric data, and so on. For example, the sensor(s) 1210 may include a heat sensor, a position sensor, a light or optical sensor, an accelerometer, a pressure transducer, a gyroscope, a magnetometer, a health monitoring sensor, and so on. Additionally, the one or more sensors 1210 may utilize any suitable sensing technology, including, but not limited to, capacitive, ultrasonic, resistive, optical, ultrasound, piezoelectric, and thermal sensing technology.

The I/O mechanism 1212 may transmit and/or receive data from a user or another electronic device. An I/O device may include a display, a touch sensing input surface such as a track pad, one or more buttons (e.g., a graphical user interface "home" button), one or more cameras, one or more microphones or speakers, one or more ports such as a microphone port, and/or a keyboard. Additionally or alternatively, an I/O device or port may transmit electronic signals via a communications network, such as a wireless and/or wired network connection. Examples of wireless and wired network connections include, but are not limited to, cellular, Wi-Fi, Bluetooth, IR, and Ethernet connections.

The foregoing description, for purposes of explanation, uses specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An image capture device, comprising:
    an imaging area comprising a plurality of color-filtered pixels arranged in Bayer pattern rows and Bayer pattern columns, wherein:
        each color-filtered pixel comprises a two-dimensional array of photodetectors;
        each photodetector in an array of photodetectors is electrically isolated from each other photodetector in the array of photodetectors; and
        a different microlens is disposed over each array of photodetectors;
    a pixel readout circuit comprising, for each color-filtered pixel:
        a shared readout circuit associated with the array of photodetectors for the color-filtered pixel; and
        a set of charge transfer transistors, each charge transfer transistor operable to connect a photodetector in the array of photodetectors to the shared readout circuit; and
    a processor configured to:
        operate the sets of charge transfer transistors for the color-filtered pixels in a first Bayer pattern row to detect a first phase difference in a first set of edges of an image; and
        operate the sets of charge transfer transistors for the color-filtered pixels in a second Bayer pattern row to detect a second phase difference in a second set of edges of the image, the first set of edges orthogonal to the second set of edges.

2. The image capture device of claim 1 wherein each shared readout circuit comprises a floating diffusion node.

3. The image capture device of claim 2, wherein the processor is configured to operate a first set of charge transfer transistors for a first color-filtered pixel to simultaneously transfer charge from a pair of photodetectors of the first color-filtered pixel to a first floating diffusion node of the first color-filtered pixel, the pair of photodetectors selected from:
    a first pair of photodetectors in a first row;
    a second pair of photodetectors in a second row;
    a third pair of photodetectors in a first column; and
    a fourth pair of photodetectors in a second column.

4. The image capture device of claim 1, further comprising:
    a lens, wherein the processor is configured to:
        identify an out-of-focus condition from at least one of the first phase difference or the second phase difference; and
        adjust a relationship between the plurality of color-filtered pixels and the lens.

5. The image capture device of claim 1, wherein each color-filtered pixel comprises a color filter disposed between the microlens and the array of photodetectors for the color-filtered pixel.

6. The image capture device of claim 1, wherein a peripheral portion of each microlens has a convex shape.

7. The image capture device of claim 1, wherein:
    operating the sets of charge transfer transistors for the color-filtered pixels in the first Bayer pattern row to detect the first phase difference comprises configuring a first set of charge transfer transistors for a first pixel to sum charges of a first pair of photodetectors aligned along a first direction;
    operating the sets of charge transfer transistors for the color-filtered pixels in the second Bayer pattern row to detect the second phase difference comprises configuring a second set of charge transfer transistors for a second pixel to sum charges of a second pair of photodetectors aligned along a second direction.

8. An image capture device, comprising:
    an imaging area comprising a plurality of color-filtered pixels arranged in Bayer pattern rows and Bayer pattern columns, wherein:
        each color-filtered pixel comprises a two-dimensional array of photodetectors;
        each photodetector in an array of photodetectors is electrically isolated from each other photodetector in the array of photodetectors; and
        a different microlens is disposed over each array of photodetectors;
    a pixel readout circuit comprising, for each color-filtered pixel:
        a shared readout circuit associated with the array of photodetectors for the color-filtered pixel; and a set of charge transfer transistors, each charge transfer transistor operable to connect a photodetector in the array of photodetectors to the shared readout circuit; and a processor configured to:
operate the sets of charge transfer transistors for the color-filtered pixels in a first Bayer pattern column to detect a first phase difference in a first set of edges of an image; and
operate the sets of charge transfer transistors for the color-filtered pixels in a second Bayer pattern column to detect a second phase difference in a second set of edges of the image, the first set of edges orthogonal to the second set of edges.

9. The image capture device of claim 8 wherein each shared readout circuit comprises a floating diffusion node.

10. The image capture device of claim 9, wherein the processor is configured to operate a first set of charge transfer transistors for a first color-filtered pixel to simultaneously transfer charge from a pair of photodetectors of the first color-filtered pixel to a first floating diffusion node of the first color-filtered pixel, the pair of photodetectors selected from:
a first pair of photodetectors in a first row;
a second pair of photodetectors in a second row;
a third pair of photodetectors in a first column; and
a fourth pair of photodetectors in a second column.

11. The image capture device of claim 8, further comprising:
a lens, wherein the processor is configured to:
identify an out-of-focus condition from at least one of the first phase difference or the second phase difference; and
adjust a relationship between the plurality of color-filtered pixels and the lens.

12. The image capture device of claim 8, wherein each color-filtered pixel comprises a color filter disposed between the microlens and the array of photodetectors for the color-filtered pixel.

13. The image capture device of claim 8, wherein a peripheral portion of each microlens has a convex shape.

14. The image capture device of claim 8, wherein:
operating the sets of charge transfer transistors for the color-filtered pixels in the first Bayer pattern column to detect the first phase difference comprises configuring a first set of charge transfer transistors for a first pixel to sum charges of a first pair of photodetectors aligned along a first direction;
operating the sets of charge transfer transistors for the color-filtered pixels in the second Bayer pattern column to detect the second phase difference comprises configuring a second set of charge transfer transistors for a second pixel to sum charges of a second pair of photodetectors aligned along a second direction.

15. An image capture device, comprising:
an imaging area comprising a plurality of color-filtered pixels arranged in Bayer pattern rows and Bayer pattern columns, wherein:
each color-filtered pixel comprises a two-dimensional array of photodetectors;
each photodetector in an array of photodetectors is electrically isolated from each other photodetector in the array of photodetectors; and
a different microlens is disposed over each array of photodetectors;
a pixel readout circuit comprising, for each color-filtered pixel:
a shared readout circuit associated with the array of photodetectors for the color-filtered pixel; and
a set of charge transfer transistors, each charge transfer transistor operable to connect a photodetector in the array of photodetectors to the shared readout circuit; and
a processor configured to:
operate the sets of charge transfer transistors for a first set of color-filtered pixels in a first Bayer pattern column to detect a first phase difference in a first set of edges of an image;
operate the sets of charge transfer transistors for a second set of color-filtered pixels in the first Bayer pattern column to detect a second phase difference in a second set of edges of the image, the first set of edges orthogonal to the second set of edges;
operate the sets of charge transfer transistors for a third set of color-filtered pixels in a second Bayer pattern column to detect the first phase difference in the first set of edges of the image; and
operate the sets of charge transfer transistors for a fourth set of color-filtered pixels in the second Bayer pattern column to detect the second phase difference in the second set of edges of the image.

16. The image capture device of claim 15 wherein each shared readout circuit comprises a floating diffusion node.

17. The image capture device of claim 16, wherein the processor is configured to operate a first set of charge transfer transistors for a first color-filtered pixel to simultaneously transfer charge from a pair of photodetectors of the first color-filtered pixel to a first floating diffusion node of the first color-filtered pixel, the pair of photodetectors selected from:
a first pair of photodetectors in a first row;
a second pair of photodetectors in a second row;
a third pair of photodetectors in a first column; and
a fourth pair of photodetectors in a second column.

18. The image capture device of claim 15, further comprising:
a lens, wherein the processor is configured to:
identify an out-of-focus condition from at least one of the first phase difference or the second phase difference; and
adjust a relationship between the plurality of color-filtered pixels and the lens.

19. The image capture device of claim 15, wherein each color-filtered pixel comprises a color filter disposed between the microlens and the array of photodetectors for the color-filtered pixel.

20. The image capture device of claim 15, wherein a peripheral portion of each microlens has a convex shape.

* * * * *